(12) United States Patent
Ohmaru et al.

(10) Patent No.: US 10,090,023 B2
(45) Date of Patent: Oct. 2, 2018

(54) MEMORY DEVICE INCLUDING MEMORY CIRCUIT AND SELECTION CIRCUIT

(71) Applicant: SEMICONDUCTOR ENERGY LABORATORY CO., LTD., Atsugi-shi, Kanagawa-ken (JP)

(72) Inventors: Takuro Ohmaru, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/479,707

(22) Filed: Sep. 8, 2014

(65) Prior Publication Data
US 2015/0070962 A1  Mar. 12, 2015

(30) Foreign Application Priority Data

Sep. 11, 2013 (JP) .................................. 2013-187831
Feb. 3, 2014 (JP) .................................. 2014-018579
Mar. 28, 2014 (JP) .................................. 2014-070121

(51) Int. Cl.
*G11C 5/14* (2006.01)
*H01L 27/12* (2006.01)
*G11C 11/403* (2006.01)

(52) U.S. Cl.
CPC ............. *G11C 5/14* (2013.01); *G11C 11/403* (2013.01); *H01L 27/1225* (2013.01); *H01L 27/1255* (2013.01)

(58) Field of Classification Search
CPC .......... G11C 5/025; G11C 5/14; G11C 11/403
(Continued)

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Alexander Sofocleous
*Assistant Examiner* — Alfredo Bermudez Lozada
(74) *Attorney, Agent, or Firm* — Fish & Richardson P.C.

(57) ABSTRACT

To provide a memory device with short overhead time and a semiconductor device including the memory device. A memory device includes a first circuit that can retain data and a second circuit by the supply of power supply voltage. The second circuit includes a third circuit that selects a first potential corresponding to the data or a second potential supplied to a first wiring; a first transistor having a channel formation region in an oxide semiconductor film; a capacitor that hold the first potential or the second potential that is selected by the third circuit and supplied through the first transistor; and a second transistor controlling a conduction state between the first circuit and a second wiring that can supply a third potential in accordance with the potential retained in the capacitor.

25 Claims, 35 Drawing Sheets

(58) Field of Classification Search
USPC .......................................... 365/72, 227, 146
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,046,615 B2 | 10/2011 | Taguchi et al. |
| 8,410,838 B2 | 4/2013 | Kato et al. |
| 8,432,187 B2 | 4/2013 | Kato et al. |
| 8,514,642 B2 | 8/2013 | Koyama |
| 8,575,985 B2 | 11/2013 | Ohmaru et al. |
| 8,681,533 B2 | 3/2014 | Fujita |
| 8,787,083 B2 | 7/2014 | Fujita |
| 9,064,599 B2 | 6/2015 | Fujita |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0187410 A1* | 8/2011 | Kato ................. G11C 14/0054 326/46 |
| 2012/0170355 A1* | 7/2012 | Ohmaru ................. G11C 11/24 365/149 |
| 2013/0049133 A1 | 2/2013 | Koyama |
| 2013/0222033 A1 | 8/2013 | Kato et al. |
| 2013/0234757 A1 | 9/2013 | Kato et al. |
| 2014/0009199 A1 | 1/2014 | Ohmaru et al. |
| 2014/0048802 A1 | 2/2014 | Ohmaru et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-110392 A | 4/1993 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-079360 A | 3/2005 |
| JP | 2009-116851 A | 5/2009 |
| JP | 2013-008432 A | 1/2013 |
| JP | 2013-009300 A | 1/2013 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States". SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. 13 (Physical Review. 8), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas". 214th ECS Meeting, 2008, No. 2317, ECS.

Kimizuka.N et al., "Spinel,YbFe2O4, and Yb2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds. In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993. vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al.. "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al.. "Development of Driver-Integrated Panel Using Amorphous In'Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B). Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26. 2007, vol. 90, No. 26, pp. 262106-1-262106-3.
Park.S et al., "Challenge to Future Displays: Transparent AM-OLED Driven by Peald Grown ZnO TFT", IMID '07 Digest. 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Watle.C, "Hydrogen as a Cause of Doping in Zinc Oxide", Phys. Rev. Lett. (Physical Review Letters), Jul. 31, 2000, vol. 85, No. 5, pp. 1012-1015.
Yamazaki.S et al., "Research, Development, and Application of Crystalline Oxide Semiconductor", SID Digest '12 : SID International Symposium Digest of Technical Papers, Jun. 5, 2012, pp. 183-186.
Kato.K et al., "Evaluation of Off-State Current Characteristics of Transistor Using Oxide Semiconductor Material, Indium.Gallium. Zinc Oxide", Jpn. J. Appl. Phys. (Japanese Journal of Applied Physics), 2012, vol. 51, pp. 021201-1-021201-7.
Inoue.H et al., "Nonvolatile Memory With Extremely Low-Leakage Indium-Gallium-Zinc-Oxide Thin-Film Transistor", IEEE Journal of Solid-State Circuits, Sep. 1, 2012, vol. 47, No. 9, pp. 2258-2265.
Kobayashi.H et al.. "Processor with 4.9-μs break-even time in power gating using crystalline In—Ga—Zn-oxide transistor", Cool Chips XVI, Apr. 17, 2013, pp. 1-3.
Kitagawa.E et al., "Impact of ultra low power and fast write operation of advanced perpendicular MTJ on power reduction for high-performance mobile CPU", IEDM 12: Technical Digest of International Electron Devices Meeting, Dec. 10, 2012, pp. 677-680.
Bartling.S et al.. "An 8MHz 75 μA/MHz Zero-Leakage Non-Volatile Logic-Based Cortex-M0 MCU SoC Exhibiting 100% Digital State Retention at VDD=0V with <400ns Wakeup and Sleep Transitions", ISSCC 2013 (Digest of Technical Papers. IEEE International Solid-State Circuits Conference), Feb. 17, 2013, pp. 432-433.
Sjokvist.N et al., "State retention flip flop architectures with different tradeoffs using crystalline indium gallium zinc oxide transistors implemented in a 32-bit normally-off microprocessor", Jpn. J. Appl. Phys.(Japanese Journal of Applied Physics), 2014, vol. 53, pp. 04EE10-1-04EE10-6.
Tamura.H et al., "Embedded SRAM and Cortex-M0 Core with Backup Circuits Using a 60-nm Crystalline Oxide Semiconductor for Power Gating", IEEE Cool Chips XVII, Apr. 14, 2014, p. 3pages.
Taiwanese Office Action (Application No. 103130828) dated Mar. 19, 2018.

\* cited by examiner

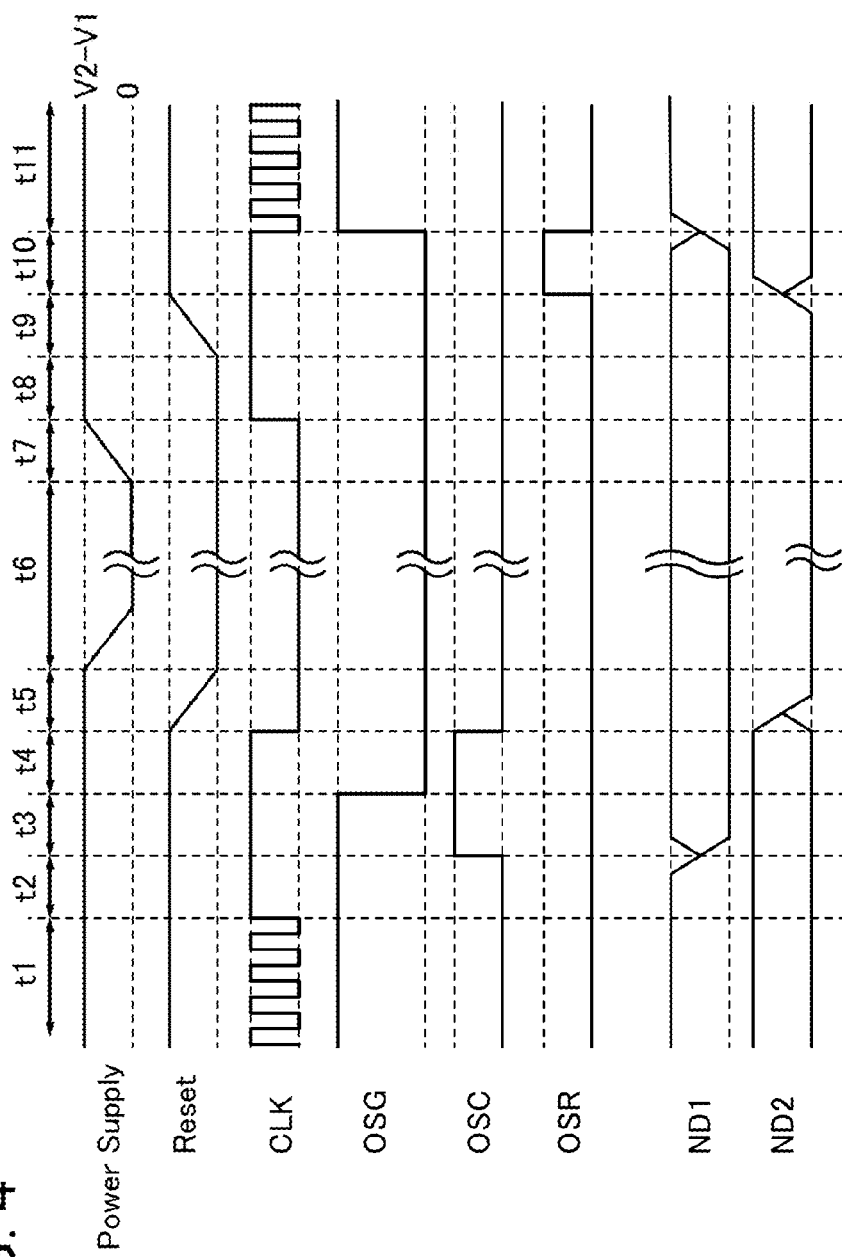

40

40

- m0_top
- isolator module
- pmu_top

- 500
- isolator module
- pmu_top

US 10,090,023 B2

MEMORY DEVICE INCLUDING MEMORY CIRCUIT AND SELECTION CIRCUIT

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a driving method thereof, or a manufacturing method thereof. In particular, one embodiment of the present invention relates to a memory device and a semiconductor device including the memory device.

2. Description of the Related Art

In recent years, a technology for reducing power consumption of a semiconductor device such as a microcomputer has been developed, and attention has been focused on power gating that is a technology to stop application of power supply voltage to power domains in a central processing unit (CPU), memory, and the like when power supply is not necessary. Patent Document 1 discloses a microcomputer in which application of power supply voltage to a CPU and memory can be stopped.

REFERENCE

Patent Document

Patent Document 1: Japanese Published Patent Application No. 2009-116851

SUMMARY OF THE INVENTION

During power gating in a semiconductor device, the time from restart of power supply to start of a normal operation of a power domain (hereinafter, referred to as the overhead time) is preferably as short as possible to operate a variety of electronic devices including the semiconductor device at high speed. Moreover, with a shorter overhead time, power gating with finer time granularity can be implemented.

Against the foregoing technical background, an object of one embodiment of the present invention is to provide a memory device with short overhead time and a semiconductor device including the memory device. Another object of one embodiment of the present invention is to provide a semiconductor device in which the potential of a node can be reset. Another object of one embodiment of the present invention is to provide a semiconductor device in which influence of leakage current is lessened. Another object of one embodiment of the present invention is to provide a semiconductor device having a long retention time. An object of one embodiment of the present invention is to provide a novel semiconductor device or the like. Note that the descriptions of these objects do not disturb the existence of other objects. In one embodiment of the present invention, there is no need to achieve all the objects. Other objects are apparent from and can be derived from the description of the specification, the drawings, the claims, and the like.

A memory device of one embodiment of the present invention includes a first circuit that can retain data and a second circuit. The second circuit includes a third circuit that selects a first potential corresponding to the data or a second potential supplied by a first wiring; a first transistor having a channel formation region in an oxide semiconductor film; a capacitor that can hold the first potential or the second potential that is selected by the third circuit and supplied through the first transistor; and a second transistor controlling a conduction state between the first circuit and a second wiring that can supply a third potential in accordance with a potential retained in the capacitor.

A memory device of one embodiment of the present invention includes a first circuit that can retain data and a second circuit. The second circuit includes a third circuit that selects a first potential corresponding to the data or a second potential supplied to a first wiring; a first transistor having a channel formation region in an oxide semiconductor film; a capacitor that can hold the first potential or the second potential that is selected by the third circuit and supplied through the first transistor; a second transistor whose conduction state is determined by a potential retained in the capacitor; and a third transistor that is connected to the second transistor in series and, in combination with the second transistor, can control a conduction state between the first circuit and a second wiring that can supply a third potential.

In the memory device of one embodiment of the present invention, the first circuit may have a function of retaining data by the supply of power supply voltage.

In the memory device of one embodiment of the present invention, the oxide semiconductor film may contain In, Ga, and Zn.

A semiconductor device of one embodiment of the present invention includes the memory device.

One embodiment of the present invention can provide a semiconductor device with short overhead time. One embodiment of the present invention can provide a semiconductor device in which the potential of a node can be reset. One embodiment of the present invention can provide a semiconductor device in which influence of leakage current is lessened. One embodiment of the present invention can provide a semiconductor device with long data retention time. Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

FIG. 4 is a timing diagram.

DETAILED DESCRIPTION OF THE INVENTION

Figure 1:
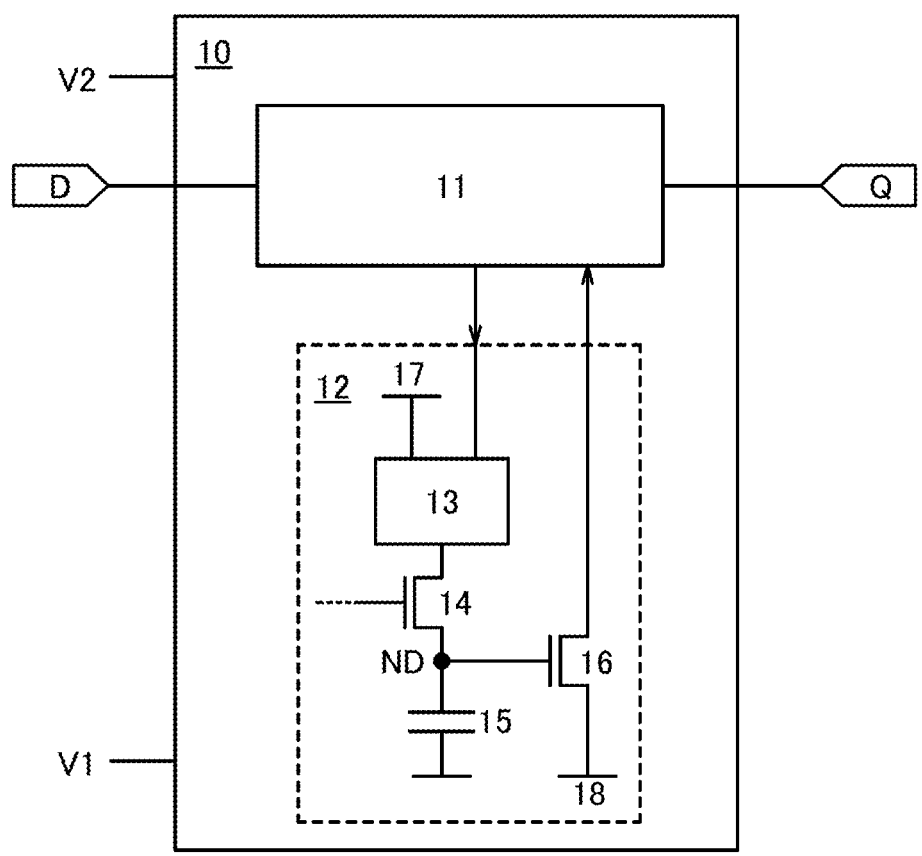
FIG. 1 is a configuration example of a memory device.

Embodiments of the present invention are described below in detail with reference to the drawings. Note that the present invention is not limited to the following description. It is easily understood by those skilled in the art that the mode and details can be variously changed without departing from the spirit and scope of the present invention. Therefore, the present invention should not be construed as being limited to the description of the embodiments below.

Note that one embodiment of the present invention includes, in its category, semiconductor devices in which power gating is performed, such as an integrated circuit, an RF tag, and a semiconductor display device. The integrated circuit includes, in its category, large scale integrated circuits (LSIs) including a microprocessor, an image processing circuit, a digital signal processor (DSP), and a microcontroller, and programmable logic devices (PLDs) such as a field programmable gate array (FPGA) and a complex PLD (CPLD). In addition, the semiconductor display device includes, in its category, semiconductor display devices, such as a liquid crystal display device, a light-emitting device in which a light-emitting element typified by an organic light-emitting element (OLED) is provided for each pixel, an electronic paper, a digital micromirror device (DMD), a plasma display panel (PDP), and a field emission display (FED).

Note that the term "connection" in this specification refers to electrical connection and corresponds to a state in which current, voltage, or a potential can be supplied or transmitted at least in an operation. Accordingly, a connection state means not only a state of direct connection but also a state of electrical connection through a circuit element such as a wiring, a resistor, a diode, or a transistor so that current, voltage, or a potential can be supplied or transmitted.

In addition, even when different components are connected to each other in a circuit diagram, there is actually a case where one conductive film has functions of a plurality of components such as a case where part of a wiring functions as an electrode. The term "connection" also means such a case where one conductive film has functions of a plurality of components.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, each of X, Y, Z1, and Z2 denotes an object (e.g., a device, an element, a circuit, a wiring, an electrode, a terminal, a conductive film, a layer, or the like).

A "source" of a transistor means a source region that is part of a semiconductor film functioning as an active layer or a source electrode that is electrically connected to the semiconductor film. Similarly, a "drain" of a transistor means a drain region that is part of a semiconductor film functioning as an active layer or a drain electrode that is electrically connected to the semiconductor film. A "gate" means a gate electrode.

The terms "source" and "drain" of a transistor interchange with each other depending on the type of the channel of the transistor or levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

<Configuration Example of Memory Device>

A configuration example of a memory device of one embodiment of the present invention is illustrated in FIG. 1. A memory device 10 in FIG. 1 includes a first memory circuit 11 and a second memory circuit 12.

As power supply voltage, potential difference between a potential V1 and a potential V2 is supplied to the memory device 10. One of the potential V1 and the potential V2 is at a high level, and the other is at a low level. Hereinafter, the case where the potential V1 is at a low level and the potential V2 is at a high level is given as an example to describe the structure example of the memory device 10 of one embodiment of the present invention.

The first memory circuit 11 has a function of retaining data when a signal D including the data is input in a period during which the power supply voltage is supplied to the memory device 10. Thus, a signal Q including the retained data is output from the first memory circuit 11.

The second memory circuit 12 has a function of reading data retained in the first memory circuit 11 to back up the data. Specifically, the second memory circuit 12 includes a selection circuit 13, a transistor 14, a capacitor 15, and a transistor 16.

The selection circuit 13 has a function of selecting a potential that corresponds to the data retained in the first memory circuit 11 or a potential supplied by a wiring 17. The potential supplied by the wiring 17 may be equal to the potential V1 or V2.

The transistor 14 has a function of controlling the supply of the potential selected by the selection circuit 13 to the capacitor 15. Specifically, when the transistor 14 is turned on, charge whose amount corresponds to a selected potential is accumulated in the capacitor 15, and thus the potential is supplied to the capacitor 15. When the transistor 14 is turned off, the charge accumulated in the capacitor 15 is retained, and thus the potential is retained in the capacitor 15.

In the case where the selection circuit 13 selects the potential supplied by the wiring 17, the amount of charge accumulated in the capacitor 15 reaches a predetermined value; thus, the potential retained in the capacitor 15 can be initialized. In the case where the selection circuit 13 selects the potential that corresponds to the data retained in the first memory circuit 11, the potential is retained in the capacitor 15, and thus the data retained in the first memory circuit 11 is backed up in the second memory circuit 12.

In the second memory circuit 12, even after the supply of the power supply voltage to the memory device 10 is stopped, the data can be retained as long as the potential corresponding to the data is retained in the capacitor 15. The period during which data is retained in the second memory circuit 12 depends on the off-state current of the transistor 14 included in the second memory circuit 12, the capacitance value of the capacitor 15, the leakage current through a gate insulating film of the transistor 16, and the like.

Note that off-state current in this specification refers to current flowing through a cut-off region between a source and a drain of a transistor, unless otherwise specified.

A blocked state (also referred to as a non-conduction state and an off state) means, in the case of an n-channel transistor, a state where voltage Vgs between a gate and a source is lower than the threshold voltage Vth, and in the case of a p-channel transistor, the voltage Vgs between the gate and the source is higher than the threshold voltage Vth. The off-state current of an n-channel transistor means, for example, drain current when the voltage Vgs between the gate and the source is lower than the threshold voltage Vth.

Drain current does not have a constant value in an off state, but depends on Vgs. For example, in an n-channel transistor, when Vgs is lower than Vth, the drain current becomes small depending on characteristics such as a sub-threshold swing value (S value). Thus, "the off-state current of a transistor is smaller than or equal to I" means "there is Vgs with which the off-state current of a transistor becomes smaller than or equal to I" in some cases. Furthermore, "the off-state current of a transistor" means "the off-state current in an off state at predetermined Vgs", "the off-state current in an off state at Vgs in a predetermined range", "the off-state current in an off state at Vgs with which sufficiently reduced off-state current is obtained", "the off-state current in an off state at Vgs that is sufficiently lower than the threshold voltage Vth in consideration of characteristics such as S value", or the like.

To secure a long data retention time, the transistor 14 preferably has a small off-state current. A transistor in which a channel formation region is included in a film of a semiconductor having a wider bandgap and lower intrinsic carrier density than silicon has extremely low off-state current and thus is preferably used in the transistor 14. Examples of such a semiconductor are an oxide semiconductor and gallium nitride that have a band gap more than twice as wide as that of silicon. A transistor including the semiconductor can have a much lower off-state current than a transistor including a normal semiconductor such as silicon or germanium. Thus, with the use of the transistor 14 having the above-described structure, even in the period during which the power supply voltage is not supplied to the memory device 10, charge retained in the capacitor 15 is prevented from being leaked and a long data retention time can be secured in the second memory circuit 12.

The transistor 16 has a function of controlling the conduction state between a wiring 18 and the first memory circuit 11 in accordance with the potential that corresponds to data and is retained in the capacitor 15. Specifically, the transistor 16 is turned on or off by the supply of the potential corresponding to the data to a gate of the transistor 16 (denoted by a node ND). When the transistor 16 is on, the potential of the wiring 18 is supplied to the first memory circuit 11. In contrast, when the transistor 16 is off, the potential of the wiring 18 is not supplied to the first memory circuit 11, and the wiring 18 is electrically isolated from the first memory circuit 11. That is, the supply of the potential corresponding to the data determines the conduction state of the transistor 16, and the conduction state determines whether the potential of the wiring 18 is supplied to the first memory circuit 11 or not. By the operation, the data in the second memory circuit 12 is written back to the first memory circuit 11.

In one embodiment of the present invention, as described above, the selection circuit 13 can select the potential supplied by the wiring 17 or the potential corresponding to the data retained in the first memory circuit 11, and the selected potential can be supplied to the capacitor 15. Thus, in the memory device 10 of one embodiment of the present invention, the potential of the node ND can be initialized by selection of the potential supplied by the wiring 17 and supply of the potential to the capacitor 15 before the data retained in the first memory circuit 11 is backed up to the second memory circuit 12. After the initialization of the potential of the node ND, the potential corresponding to the data retained in the first memory circuit 11 is selected so that the potential can be supplied to the capacitor 15.

In the memory device of one embodiment of the present invention, as described above, the potential of the node ND is initialized before data is backed up to the second memory circuit 12; thus, data can be written to the second memory circuit 12 at high speed.

First, the reason why the initialization of the potential of the node ND enables high-speed data writing is described assuming that the power supply voltage is high, that is, the potential difference between the potentials V1 and V2 is large. In the case where the gate voltage, which is voltage of the gate to a source of the transistor 16, is equal to the threshold voltage, the potential of the node ND is referred to as the potential V0. The potential V0 is between the potentials V1 and V2, and the conduction state of the transistor 16 is changed when the node ND becomes the potential V0. Although the potential V0 is between the potentials V1 and V2, the potential difference between the potentials V2 and V0 is not necessarily equal to that between the potentials V0 and V1. Thus, for example, when the potential difference between the potentials V2 and V0 is larger than that between the potentials V0 and V1, the time needed for the node ND to reach the potential V0 is longer in the case where the potential V1 is supplied to the node ND in which the potential V2 is retained than in the case where the potential V2 is supplied to the node ND in which the potential V1 is retained; consequently, the change of the conduction state of the transistor 16 is slow. Particular when the power supply voltage is low and the potential difference between the potentials V1 and V2 is small, a large gap is unlikely to be made between the potential difference between the potentials V2 and V0 and the potential difference between the potentials V0 and V1; thus, the speed of the change of the conduction state of the transistor 16 (or the time needed for the change) in the case where the potential V1 is supplied to the node ND in which the potential V2 is retained is unlikely to greatly differ from the speed of the change in the case where the potential V2 is supplied to the node ND in which the potential V1 is retained. In contrast, in the case where the power supply voltage is high, the speed in the case where the potential V1 is supplied to the node ND in which the potential V2 is retained tends to greatly differ from that in the case where the potential V2 is supplied to the node ND in which the potential V1 is retained. In the second memory circuit 12 in the memory device 10 of one embodiment of the present invention, the potential of the node ND can be initialized by the supply of, for example, the potential V1 from the wiring 17 to the node ND, before the potential V2 or V1 that reflects the data is supplied to the node ND. With the configuration, even in the case where the potential difference between the potentials V2 and V0 is larger than that between the potentials V0 and V1, the time needed to supply the potential V1 to the node ND can be shortened by the supply of the potential V1 to the node ND in advance. As a result, data can be written to the second memory circuit 12 at high speed. In other words, data can be written in a short time.

In the case where the power supply voltage is low, as described above, writing speed (write time) of data to the second memory circuit 12 is not likely to be affected by a relation between the potential V0 and the potential V1 or V2; however, a change in on-state current caused by a change in the gate voltage of the transistor 14 more greatly affects the speed. The reason why the initialization of the potential of the node ND enables high-speed data writing is described assuming that the power supply voltage is low, that is, the potential difference between the potentials V1 and V2 is small.

When the potential corresponding to the data is supplied to the node ND through the transistor 14, one of a source and a drain of the transistor 14 is supplied with the potential corresponding to the data. Moreover, the other of the source and the drain of the transistor 14 is connected to the node ND. Thus, in the case where the transistor 14 is an n-channel transistor and the potential of the node ND is lower than the potential corresponding to the data, the gate voltage of the transistor 14 depends on the potential of its gate and the potential of the node ND. Therefore, as the potential of the node ND increases with time, the gate voltage of the transistor 14 becomes low, and thus the on-state current is decreased. Consequently, the speed of increase of the potential of the node ND is reduced with time. That is, the time for writing data to the second memory circuit 12 becomes longer. In contrast, when the potential of the node ND is higher than the potential corresponding to the data, the gate voltage of the transistor 14 depends on the gate and the potential corresponding to the data. Thus, the gate voltage of the transistor 14 is not changed unless the two potentials are changed, and the speed of increase of the potential of the node ND is not reduced with time. That is, in the case where the transistor 14 is an n-channel transistor, the potential of the node ND is initialized so that the potential of the node ND becomes higher than the potential corresponding to the data, whereby the speed for writing data to the second memory circuit 12 can be increased. In the case where the transistor 14 is a p-channel transistor, the potential of the node ND is initialized so that the potential of the node ND becomes lower than the potential corresponding to the data, whereby the speed for writing data to the second memory circuit 12 can be increased.

In a semiconductor device including the memory device of one embodiment of the present invention, by increasing the speed for writing data to the second memory circuit 12, power gating with fine time granularity can be performed.

The initialization of the potential of the node ND that is performed before data is backed up to the second memory circuit 12 may be performed by the supply of the potential V1 to the node ND or by the supply of the potential V2 to the node ND. It is preferable that a potential at which data can be written to the second memory circuit 12 at high speed be selected as appropriate and used to initialize the potential of the node ND.

In the second memory circuit 12 in which charge in the capacitor 15 is retained by the transistor 14 having an extremely small off-state current, power required for data writing depends on the amount of charge in the capacitor 15. Thus, overhead power consumed by data backup is suppressed, as compared to the case of using a magnetoresistive random access memory (MRAM) or the like. As a result, in the memory device 10, break even time (BET) can be shortened as compared to the case of using the MRAM and thus power consumption in the semiconductor device can be suppressed.

That is, in the second memory circuit 12, energy required for data writing corresponds to the energy required for the charge and discharge of the charge in the capacitor 15. In contrast, in a memory circuit using a two-terminal memory element such as an MRAM, energy required for data writing corresponds to energy consumed when current flows in the memory element. Thus, as compared to the case of using an MRAM or the like in which current keeps flowing while data is written, in the second memory circuit 12, energy consumed by data backup can be reduced. Therefore, in the memory device 10, as compared to the case of using an MRAM or the like, BET can be shortened. Consequently, chances for performing power gating by which energy consumption can be reduced are increased, so that the power consumption of the semiconductor device can be reduced.

Accordingly, in the semiconductor device using the memory device of one embodiment of the present invention, power gating with fine time granularity is achieved and the effect of reducing power consumption which is obtained by the power gating with fine time granularity is increased.

Figure 22:
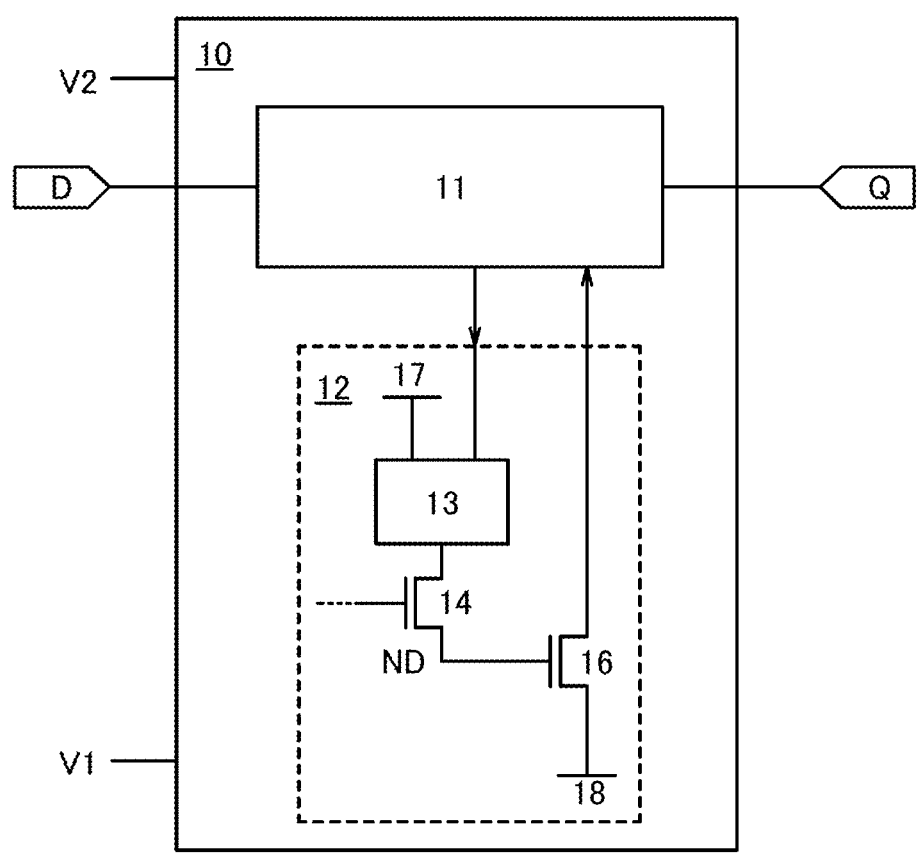
FIG. 22 is a configuration example of a memory device.
Figure 23:
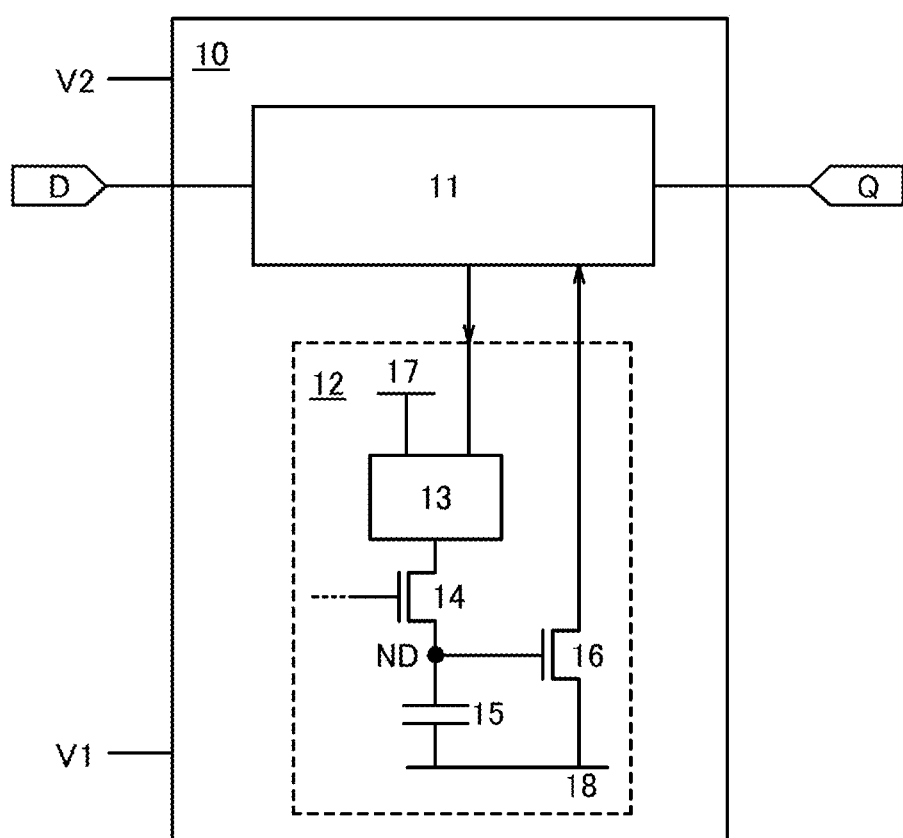
FIG. 23 is a configuration example of a memory device.

The capacitor 15 may be omitted when the gate capacitance of the transistor 16 is used. FIG. 22 illustrates an example of this case. Note that one terminal of the capacitor 15 is connected to the gate of the transistor 16, and the other terminal of the capacitor 15 can be connected to any of various wirings. For example, as illustrated in FIG. 23, the other terminal of the capacitor 15 can be connected to the wiring 18.

<Specific Structure Example 1 of Memory Device>

Figure 2:
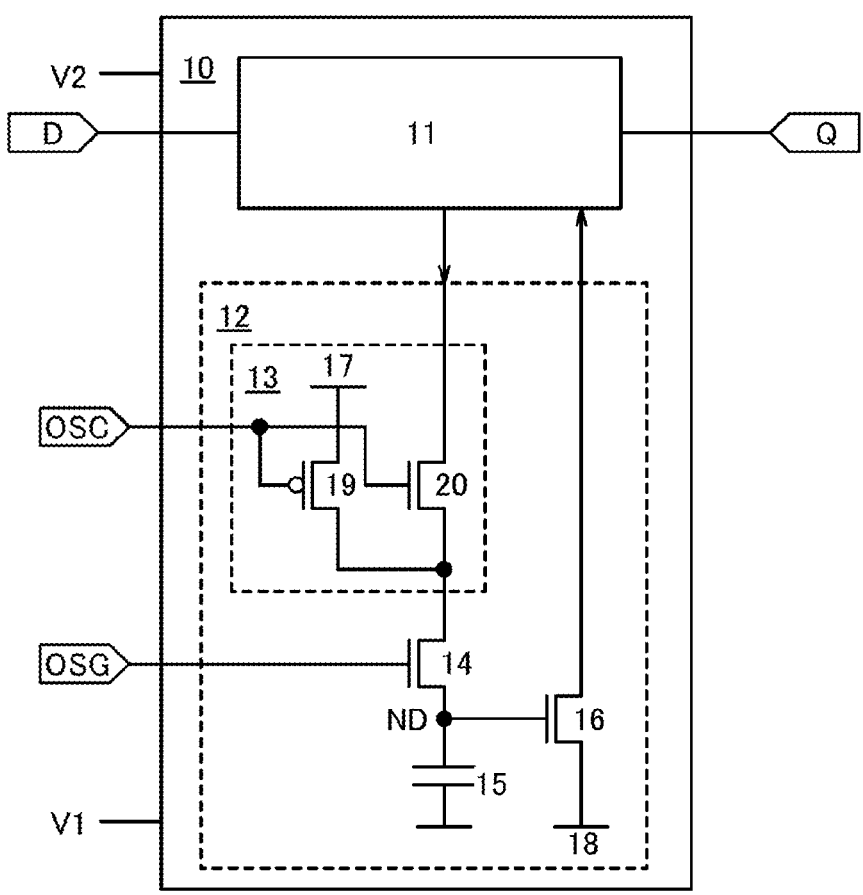
FIG. 2 is a configuration example of a memory device.

Next, a more specific example of a structure of the memory device 10 illustrated in FIG. 1 is shown in FIG. 2. In FIG. 2, in the memory device 10, the selection circuit 13 includes a p-channel transistor 19 and an n-channel transistor 20.

When the transistor 14 is on, the transistor 19 has a function of controlling the supply of the potential of the wiring 17 to the capacitor 15. When the transistor 14 is on, the transistor 20 has a function of controlling the supply of the potential corresponding to the data retained in the first memory circuit 11 to the capacitor 15.

Specifically, in FIG. 2, a gate of the transistor 19 is connected to a gate of the transistor 20. The conduction states of the transistors 19 and 20 are determined in accordance with the potential of a signal OSC supplied to the gate of the transistor 19 and the gate of the transistor 20. One of a source and a drain of the transistor 19 is connected to the wiring 17. The other of the source and the drain of the transistor 19 is connected to one of a source and a drain of the transistor 14. One of a source and a drain of the transistor 20 is connected to the first memory circuit 11, and the other of the source and the drain of the transistor 20 is connected to the one of the source and the drain of the transistor 14.

A gate of the transistor 14 is supplied with the signal OSG, and the conduction state of the transistor 14 is determined by the potential of the signal OSG.

When one of the transistors 19 and 20 is on, the other is off. Thus, when the transistor 14 is on in accordance with the potential of the signal OSG, the selection circuit 13 can supply the potential of the wiring 17 to the capacitor 15 through the transistor 19 or can supply the potential corresponding to the data retained in the first memory circuit 11 to the capacitor 15 through the transistor 20.

Figure 21:
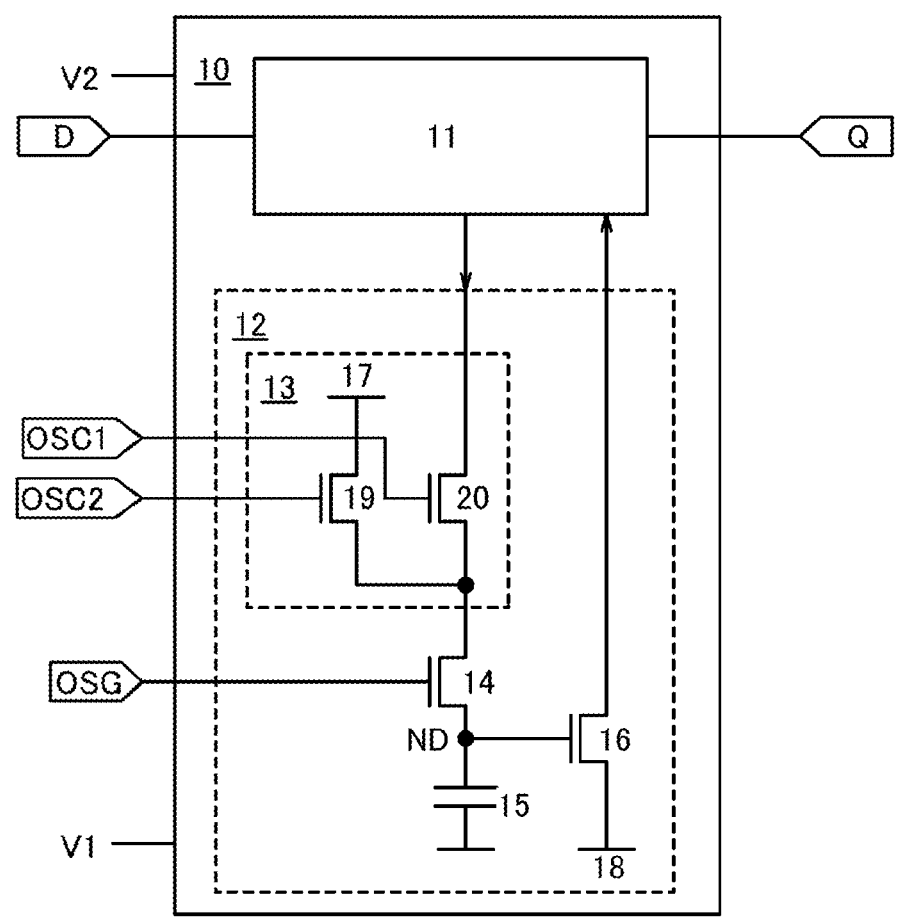
FIG. 21 is a configuration example of a memory device.

Note that although FIG. 2 shows the case where the gate of the transistor 19 is connected to the gate of the transistor 20, one embodiment of the present invention is not limited to this. As illustrated in FIG. 21, the transistors 19 and 20 may be controlled separately with the use of a signal OSC1 and a signal OSC2. In that case, the transistors 19 and 20 may have the same polarity or different polarities.

<Specific Structure Example 2 of Memory Device>

Figure 3:
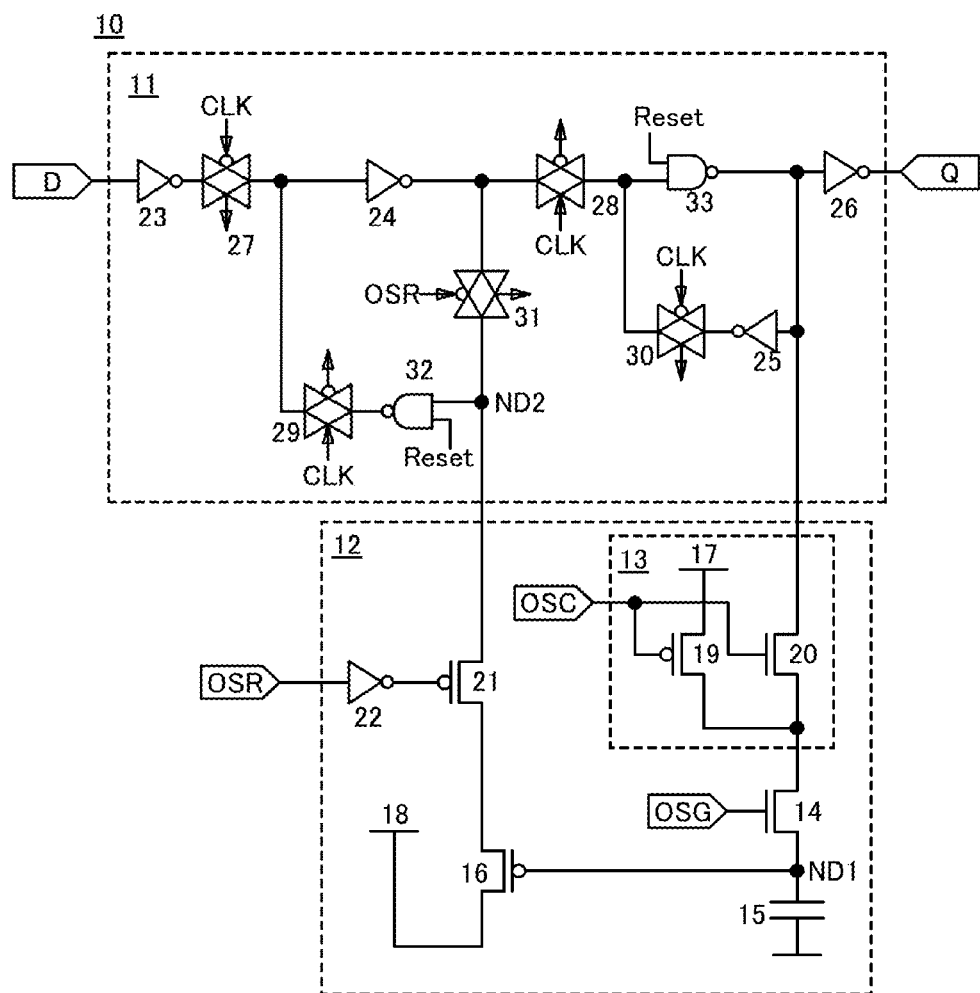
FIG. 3 is a configuration example of a memory device.

Next, a more specific example of a structure of the memory device 10 illustrated in FIG. 1 is shown in FIG. 3.

The transistor 16, which is an n-channel transistor in FIG. 1, is a p-channel transistor in FIG. 3.

In FIG. 3, as in the memory device 10 illustrated in FIG. 2, the selection circuit 13 includes the p-channel transistor 19 and the n-channel transistor 20.

In FIG. 3, the second memory circuit 12 includes a p-channel transistor 21 serving as a switch between the first memory circuit 11 and the transistor 16. A signal OSR is input to a gate of the transistor 21 through an inverter 22, and the conduction state of the transistor 21 is determined by the potential of the signal OSR.

In FIG. 3, the first memory circuit 11 is a sequential circuit. Specifically, the first memory circuit 11 includes inverters 23 to 26, transmission gates 27 to 31, and NANDs 32 and 33.

The transmission gates 27 and 30 are supplied with a signal CLK. In each of the transmission gates 27 and 30, an input signal is output without changing a logical value when the potential of the signal CLK is at a low level, and the output becomes high impedance when the potential of the signal CLK is at a high level. The transmission gates 28 and 29 are supplied with the signal CLK. In each of the transmission gates 28 and 29, an input signal is output without changing a logical value when the potential of the signal CLK is at a high level, and the output becomes high impedance when the potential of the signal CLK is at a low level. The transmission gate 31 is supplied with the signal OSR. In the transmission gate 31, an input signal is output without changing a logical value when the potential of the signal OSR is at a low level, and the output becomes high impedance when the potential of the signal OSR is at a high level.

The signal D supplied to the first memory circuit 11 is supplied to the transmission gate 27 through the inverter 23. A signal output from the transmission gate 27 is supplied to the transmission gates 28 and 31 through the inverter 24. A signal output from the transmission gate 31 is input to a first terminal (denoted by a node ND2) of the NAND 32. A signal Reset is input to a second terminal of the NAND 32. A signal output from the NAND 32 is input to the transmission gate 29. A signal output from the transmission gate 29 is supplied to the transmission gates 28 and 31 through the inverter 24.

A signal output from the transmission gate 28 is input to a second terminal of the NAND 33. The signal Reset is input to a first terminal of the NAND 33. A signal output from the NAND 33 is output from the first memory circuit 11 as the signal Q through the inverter 26. A signal output from the NAND 33 is input to the transmission gate 30 through the inverter 25. A signal output from the transmission gate 30 is input to the second terminal of the NAND 33.

A signal output from the NAND 33 has the potential corresponding to the data retained in the first memory circuit 11. The potential of the signal is supplied to the second memory circuit 12. In the second memory circuit 12, when the transistors 14 and 20 are on, the data is retained by the supply of the potential of the signal to the capacitor 15 through the transistors 14 and 20. The conduction state of the transistor 16 is determined by the potential of the signal supplied to its gate (denoted by a node ND1). When the transistors 16 and 21 are on, the potential of the wiring 18 is supplied to the first memory circuit 11 through the transistors 16 and 21. In the first memory circuit 11, the potential of the wiring 18 is supplied to the node ND2, so that the data is written back.

In the case where the potential of the signal is supplied to the node ND1, the potential of the node ND1 does not have to correspond to the potential of the signal. The potential of the node ND1 may have any value as long as the same data as in the case where the potential of the signal is supplied to the node ND1 is retained. For example, the potential of the node ND1 may have any value as long as, at the time of write back, the conduction state (on or off) of the transistor 16 that is determined by the potential of the node ND1 is the same as the conduction state (on or off) of the transistor 16 that is determined when the potential of the signal is supplied as a gate signal. The same applies to the case where the potential V1 is supplied to the node ND1, the case where the potential V2 is retained in the node ND1, and the like.

Although the signal OSR is input to the gate of the transistor 21 through the inverter 22 here, when the value of the signal OSR is inverted, the inverter 22 may be omitted.

<Operation Example of Memory Device>

FIG. 4 shows a timing diagram of one operation example of the memory device 10 illustrated in FIG. 3. FIG. 4 exemplifies a timing diagram of the case where the potential V2 is supplied to the wirings 17 and 18.

In Time t1, the power supply voltage corresponding to the potential difference between the potentials V1 and V2 is supplied to the memory device 10. The signal CLK has a high-level potential and a low-level potential that are periodically repeated. The potential of the signal Reset is at a high level, the potential of the signal OSG is at a high level, the potential of the signal OSC is at a low level, and the potential of the signal OSR is at a low level. Thus, in Time t1, the first memory circuit 11 performs the normal operation as a sequential circuit. The potential V2 is supplied from the wiring 17 through the transistors 19 and 14 to the node ND1. The potential V1 or V2 corresponding to data of the signal D is supplied to the node ND2.

In Times t2 to t5, data in the first memory circuit 11 is backed up to the second memory circuit 12.

Specifically, in Time t2, the power supply voltage is supplied to the memory device 10. The potential of the signal CLK is fixed at a high level. The potential of the signal Reset is at a high level, the potential of the signal OSG is at a high level, the potential of the signal OSC is at a low level, and the potential of the signal OSR is at a low level. Thus, in Time t2, in the first memory circuit 11, the potential of the node ND2 is fixed to V1 or V2. The potential V2 is supplied from the wiring 17 through the transistors 19 and 14 to the node ND1.

In Time t3, the power supply voltage is supplied to the memory device 10. The potential of the signal CLK is fixed at a high level. The potential of the signal Reset is at a high level, the potential of the signal OSG is at a high level, the potential of the signal OSC is at a high level, and the potential of the signal OSR is at a low level. Thus, in Time t3, the potential V1 or V2 of the signal output from the NAND 33 is supplied to the node ND1 through the transistors 20 and 14.

In Time t4, the power supply voltage is supplied to the memory device 10. The potential of the signal CLK is fixed at a high level. The potential of the signal Reset is at a high level, the potential of the signal OSG is at a low level, the potential of the signal OSC is at a high level, and the potential of the signal OSR is at a low level. Thus, in Time t4, the transistor 14 is turned off, whereby the potential V1 or V2 that is supplied to the node ND1 in Time t3 is retained.

In Time t5, the power supply voltage is supplied to the memory device 10. The potential of the signal CLK is fixed at a low level. The potential of the signal Reset is changed from a high level to a low level, the potential of the signal OSG is at a low level, the potential of the signal OSC is at a low level, and the potential of the signal OSR is at a low level. Thus, in Time t5, as in Time t4, the potential V1 or V2 is retained in the node ND1.

In this specification, backup (also called store) of data means an operation in which data in the first memory circuit 11 is written to the second memory circuit 12. When the term "backup" is simply used, the backup means data backup or a sequence of operations from a data backup operation to an operation right before power supply is stopped in some cases. Note that the meaning of "backup" can be understood from the context in some cases. When the term "backup" is simply used, the backup means a sequence of operations up to an operation right before power supply is stopped in some cases. Time t2 is a period during which the operation of the memory device 10 is stopped by fixing the signal CLK, that is, a preparation period for backup. Thus, Time t2 is not included in backup in some cases.

In Time t6, the supply of the power supply voltage to the memory device 10 is stopped. Specifically, the potential V1 is supplied to a terminal or a wiring to which the potential V2 is supplied in Times t1 to t5. The potential of the signal CLK is fixed at a low level. The potential of the signal Reset is at a low level, the potential of the signal OSG is at a low level, the potential of the signal OSC is at a low level, and the potential of the signal OSR is at a low level. In Time t6, as in Times t4 and t5, the potential V1 or V2 is retained in the node ND1.

In Times t7 to t10, the power supply voltage is supplied, and data is recovered from the second memory circuit 12 to the first memory circuit 11.

Specifically, in Time t7, the supply of the power supply voltage to the memory device 10 is resumed. The potential of the signal CLK is kept fixed at a low level. The potential of the signal Reset is at a low level, the potential of the signal OSG is at a low level, the potential of the signal OSC is at a low level, and the potential of the signal OSR is at a low level.

In Time t8, the power supply voltage is supplied to the memory device 10. The potential of the signal CLK is fixed at a high level. The potential of the signal Reset is at a low level, the potential of the signal OSG is at a low level, the potential of the signal OSC is at a low level, and the potential of the signal OSR is at a low level. Thus, the potential V1 is supplied to the node ND2.

In Time t9, the power supply voltage is supplied to the memory device 10. The potential of the signal CLK is fixed at a high level. The potential of the signal Reset is changed from a low level to a high level, the potential of the signal OSG is at a low level, the potential of the signal OSC is at a low level, and the potential of the signal OSR is at a low level.

In Time t10, the power supply voltage is supplied to the memory device 10. The potential of the signal CLK is fixed at a high level. The potential of the signal Reset is at a high level, the potential of the signal OSG is at a low level, the potential of the signal OSC is at a low level, and the potential of the signal OSR is at a high level. Thus, in the case where the value obtained by subtracting the potential of the wiring 18 from the potential retained in the node ND1 is lower than the threshold voltage of the transistor 16, the transistor 16 is on; thus, the potential V2 of the wiring 18 is supplied to the node ND2 in the first memory circuit 11 through the transistor 21. In the case where the value obtained by subtracting the potential of the wiring 18 from the potential retained in the node ND1 is higher than the threshold voltage of the transistor 16, the transistor 16 is off; thus, the node ND2 of the first memory circuit 11 retains the potential V1. By the above operation, the potential corresponding to the data is written back to the node ND2.

In this specification, recovery (also called restore) means recovery from a state in which power supply is stopped or data recovery in some cases. The recovery from a state in which power supply is stopped includes the supply of the power supply voltage and data recovery, and means a sequence of operations from an operation in which power supply is stopped to an operation right before the normal operation starts in some cases. Note that the meaning of "recovery" can be understood from the context in some cases. When the term "recovery" is simply used, the recovery means the recovery from a state in which power supply is stopped in some cases.

In Time t11, the power supply voltage is supplied to the memory device 10. The signal CLK has a high-level potential and a low-level potential that are periodically repeated. The potential of the signal Reset is at a high level, the potential of the signal OSG is at a high level, the potential of the signal OSC is at a low level, and the potential of the signal OSR is at a low level. Thus, in Time t11, the first memory circuit 11 performs normal operation as a sequential circuit. The potential V2 is supplied from the wiring 17 through the transistors 19 and 14 to the node ND1. The potential V1 or V2 corresponding to the data of the signal D is supplied to the node ND2.

<Supply of Power Supply Voltage to Memory Device>

Figure 5A:
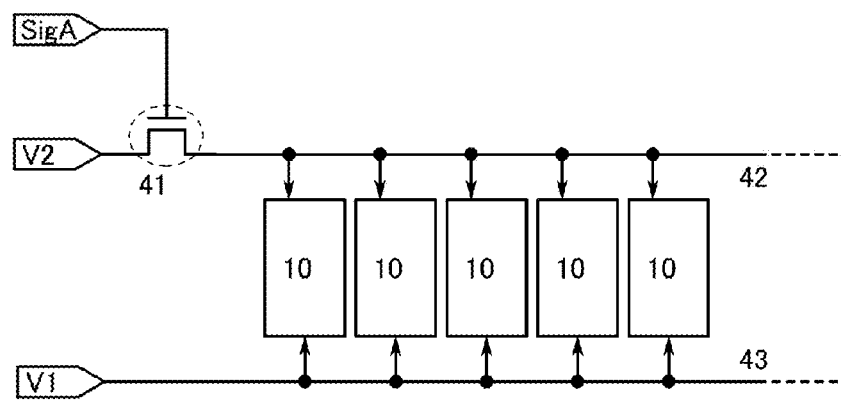
FIGS. 5A and 5B each show a configuration example of a memory device.

In FIG. 5A, a configuration example of a memory device 40 including a plurality of the memory devices 10 is shown. The memory device 40 in FIG. 5A includes a switch 41 and the plurality of memory devices 10. In addition, the potential V2 applied to a wiring 42 through the switch 41 is supplied to each of the memory devices 10. Furthermore, the potential V1 is applied to each of the memory devices 10 through a wiring 43.

FIG. 5A shows an example in which a single transistor is used as the switch 41. The on/off selection (switching) of the switch 41 is controlled by a signal SigA. By the switch 41, the supply of the potential V2 to each of the memory devices 10 can be controlled.

Figure 5B:
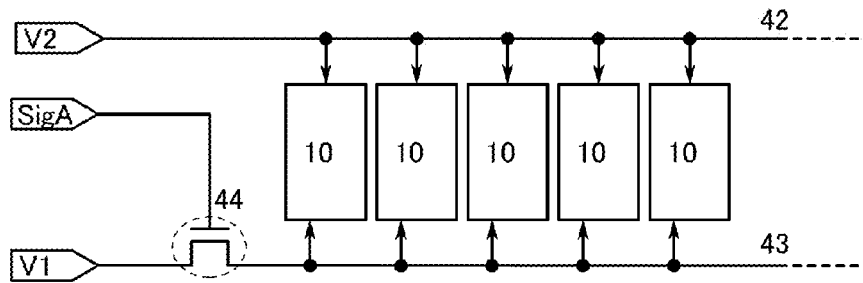

The memory device in FIG. 5B includes a switch 44 and the plurality of memory devices 10. The potential V1 applied to the wiring 43 through the switch 44 is supplied to each of the memory devices 10. Furthermore, the potential V2 is applied to each of the memory devices 10 through the wiring 42.

FIG. 5B shows an example in which a single transistor is used as the switch 44. The switching of the switch 44 is controlled by the signal SigA. By the switch 44, the supply of the potential V1 to each of the memory devices 10 can be controlled.

<Configuration Example of Semiconductor Device>

Figure 6:
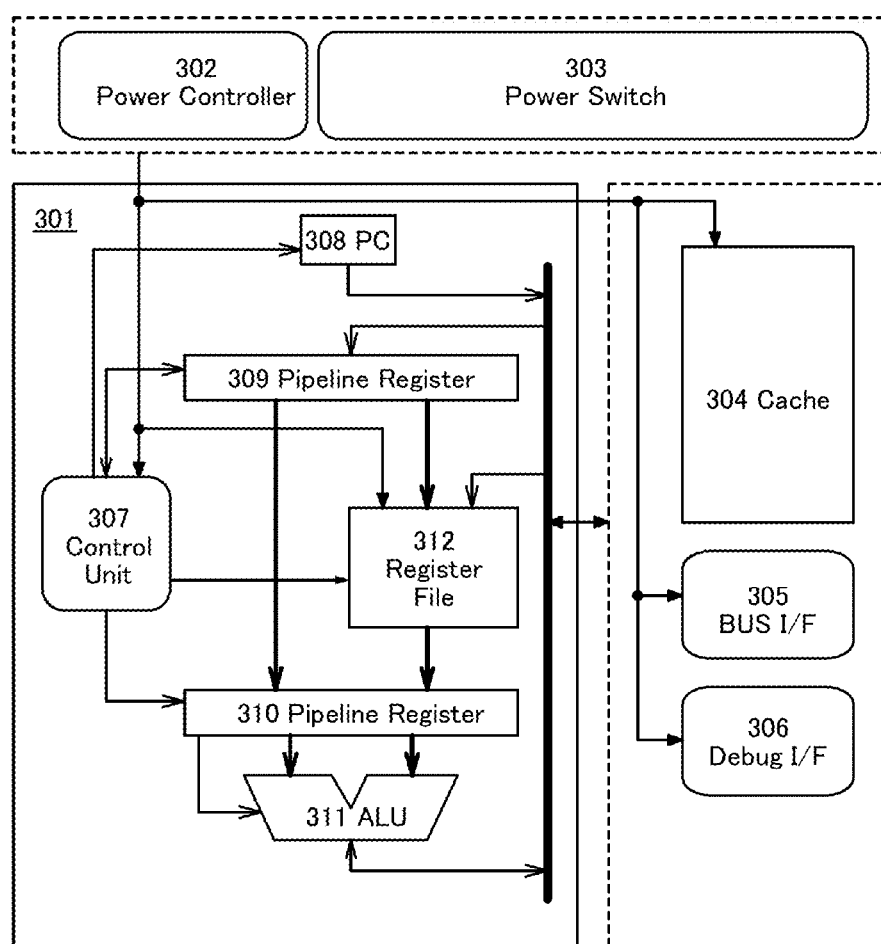
FIG. 6 illustrates a configuration of a semiconductor device.

An example of a configuration of a semiconductor device including the memory device of one embodiment of the present invention is illustrated in FIG. 6. A semiconductor device 300 in FIG. 6 includes a CPU core 301, a power controller 302, a power switch 303, a cache 304, a bus interface 305, and a debug interface 306. The CPU core 301 includes a control unit 307, a program counter (PC) 308, a pipeline register 309, a pipeline register 310, an arithmetic logic unit (ALU) 311, and a register file 312. A memory device of one embodiment of the present invention can be used for the pipeline register 309, the pipeline register 310, the register file 312, and a register, a flip-flop, or the like included in another circuit.

The control unit 307 controls all the operations of the PC 308, the pipeline register 309, the pipeline register 310, the ALU 311, the register file 312, the cache 304, the bus interface 305, the debug interface 306, and the power controller 302. The control unit 307 has a function of decoding input instructions contained in a program such as applications.

The ALU 311 has a function of performing a variety of arithmetic operations such as four arithmetic operations and logic operations.

The cache 304 has a function of temporarily storing frequently-used data. The PC 308 is a register having a function of storing an address of an instruction to be executed next. The pipeline register 309 has a function of temporarily storing instructions. Although not shown in FIG. 6, the semiconductor device 300 includes a cache controller for controlling the operation of the cache 304.

The register file 312 includes a plurality of registers including a general purpose register and can retain data that is read out from the cache 304, data that is obtained as a result of the arithmetic operations in the ALU 311, and the like.

The pipeline register 310 has a function of temporarily storing data obtained during arithmetic processing performed by the ALU 311 or data obtained as a result of performing arithmetic processing by the ALU 311.

The bus interface 305 functions as a path for data between the semiconductor device 300 and devices outside the semiconductor device. The debug interface 306 functions as a path of a signal for inputting an instruction to control debugging to the semiconductor device 300. The bus interface 305 and the debug interface 306 are each provided with a register.

The power switch 303 has a function of controlling the supply of power supply voltage to a circuit included in the semiconductor device 300 other than the power controller 302. The circuit is included in power domains. The circuits included in the same power domain are uniformly controlled to be supplied with the power supply voltage by the power switch 303. The power controller 302 has a function of controlling the operation of the power switch 303.

Description is made on the operation of power gating of the semiconductor device 300 having the aforementioned configuration.

First, by the CPU core 301, timing for stopping the supply of the power supply voltage in a register of the power controller 302 is set. Then, a signal of starting power gating is sent from the CPU core 301 to the power controller 302. Then, a register and the cache 304 included in the semiconductor device 300 starts data backup. Then, the power switch 303 stops the supply of power supply voltage to the circuits other than the power controller 302 included in the semiconductor device 300. Then, an interrupt signal is input to the power controller 302, whereby the supply of the power supply voltage to the circuits included in the semiconductor device 300 is started. Note that a counter may be provided in the power controller 302, so that the timing of starting the supply of the power supply voltage is determined not by the input of an interrupt signal but by the counter. Next, the register and the cache 304 start data recovery. After that, the instruction is executed again in the CPU core 301.

<Example of Cross-Sectional Structure of Memory Device>

Figure 7:
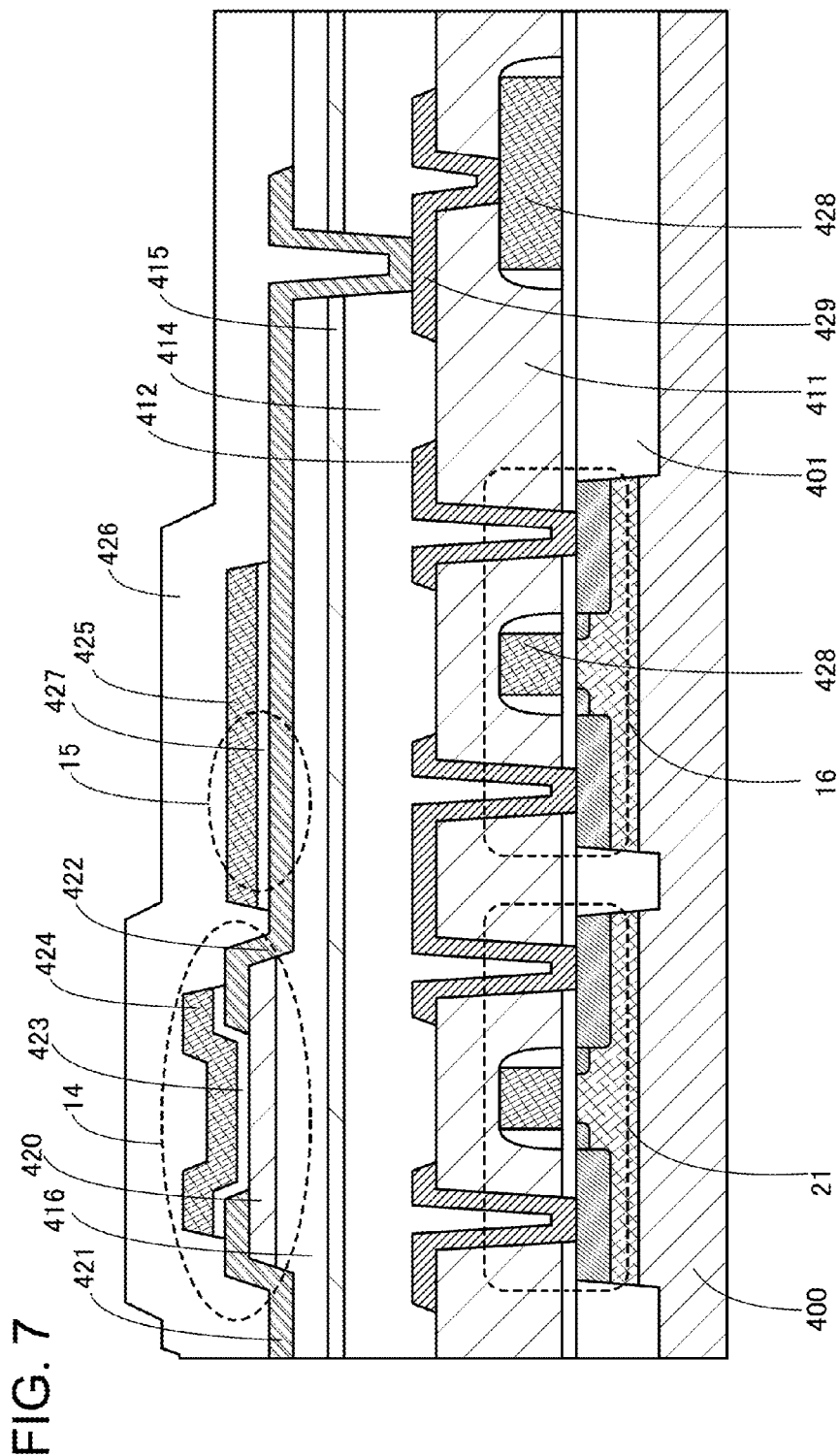
FIG. 7 illustrates a cross-sectional structure of a memory device.

FIG. 7 illustrates an example of a cross-sectional structure of a memory device. FIG. 7 exemplifies cross-sectional structures of the transistors 14, 16, and 21 and the capacitor 15 illustrated in FIG. 3.

In FIG. 7, the transistor 14 having a channel formation region in an oxide semiconductor film and the capacitor 15 are formed over the p-channel transistors 21 and 16 each having a channel formation region in a single crystal silicon substrate.

The transistors 16 and 21 may each have a channel formation region in a semiconductor film or a semiconductor substrate of silicon, germanium, or the like in an amorphous, microcrystalline, polycrystalline, or single crystal state. Alternatively, the transistors 16 and 21 may each have the channel formation region in an oxide semiconductor film or an oxide semiconductor substrate. In the case where channel formation regions of all the transistors are included in an oxide semiconductor film or an oxide semiconductor substrate, the transistor 14 is not necessarily stacked over the transistors 16 and 21, and all the transistors may be formed in the same layer.

In the case where the transistors 16 and 21 are formed using a thin silicon film, any of the following can be used: amorphous silicon formed by sputtering or vapor phase growth such as plasma CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 400 where the transistors 16 and 21 are formed can be, for example, a silicon substrate, a germanium substrate, or a silicon germanium substrate. In FIG. 7, a single crystal silicon substrate is used as the semiconductor substrate 400.

The transistors 16 and 21 are electrically isolated from each other by an element isolation method. As the element isolation method, a local oxidation of silicon (LOCOS) method, a shallow trench isolation (STI) method, or the like can be employed. In FIG. 7, an example in which the trench isolation method is used to electrically isolate the transistors 16 and 21 is shown. Specifically, in the example illustrated in FIG. 7, to electrically isolate the transistors 16 and 21, after trenches are formed in the semiconductor substrate 400 by etching or the like, element separation regions 401 are formed by embedding an insulating material such as silicon oxide in the trenches.

Less leakage of charge from a gate electrode through the gate insulating film to a source electrode or a drain electrode in the transistor 16 leads to a longer data retention time in the second memory circuit 12. In the case where the gate insulating film of the transistor 16 is, for example, a silicon oxide film, the thickness of the silicon oxide film is preferably greater than or equal to 5 nm and less than or equal to 15 nm, more preferably greater than or equal to 5 nm and less than or equal to 8 nm. Note that one embodiment of the present invention is not limited to this.

Alternatively, the gate insulating film of the transistor 16 preferably has a thickness larger than that of a gate insulating film of a transistor in the first memory circuit 11, the second memory circuit 12, or the selection circuit 13. In that case, the first memory circuit 11 can operate at high speed, whereas leakage current can be reduced in the transistor 16. Note that one embodiment of the present invention is not limited to this.

For example, not only the gate insulating film of the transistor 16 but also a gate insulating film of a transistor in the second memory circuit 12 or the selection circuit 13 may have a thickness larger than that of the gate insulating film of the transistor in the first memory circuit 11. The second memory circuit 12 and the selection circuit 13 do not have to operate at high speed; thus, when their gate insulating films each have approximately the same thickness as the gate insulating film of the transistor 16, the memory device can be manufactured easily in some cases.

Figure 24:
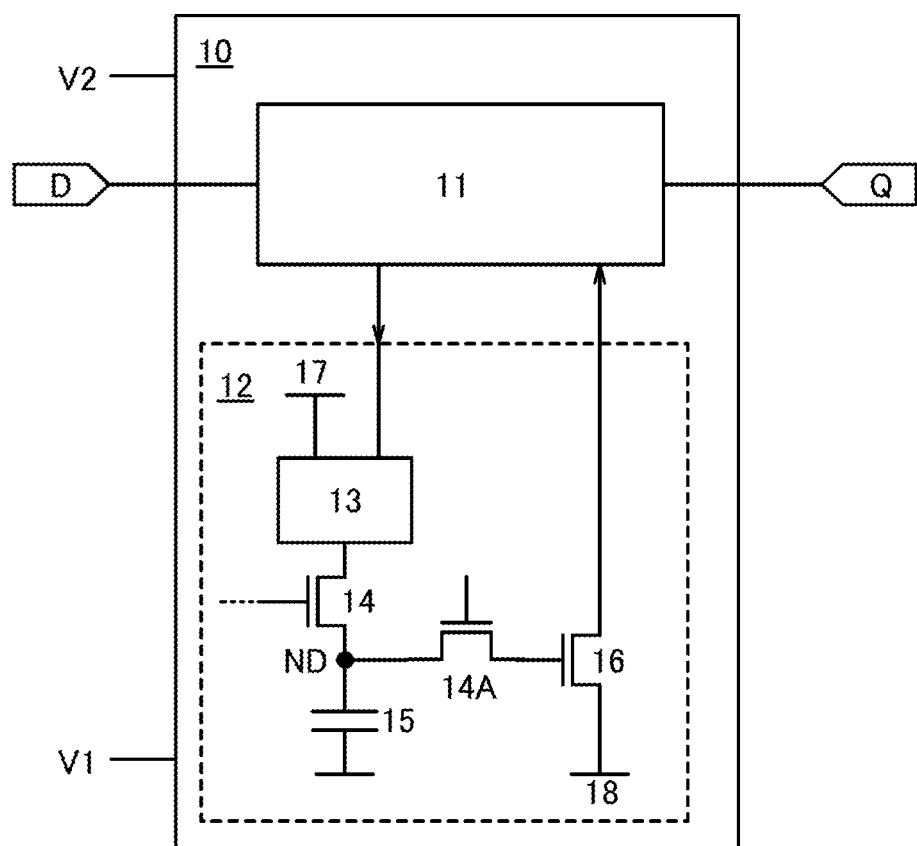
FIG. 24 is a configuration example of a memory device.

For example, as illustrated in FIG. 24, a transistor 14A may be provided between the capacitor 15 and a gate of the transistor 16. As the transistor 14A, a transistor of a similar kind to the transistor 14 may be used. In that case, charge retention time in the capacitor 15 can be lengthened.

An insulating film 411 is provided over the transistors 16 and 21. Openings are formed in the insulating film 411. In the openings, a plurality of conductive films each connected to any of the sources and drains of the transistors 16 and 21 and a conductive film 429 connected to a gate 428 of the transistor 16 are provided over the insulating film 411.

An insulating film 414 is provided over the insulating film 411. An insulating film 415 having an effect of blocking diffusion of oxygen, hydrogen, and water is provided over the insulating film 414. As the insulating film 415 has higher density and becomes denser or has a fewer dangling bonds and becomes more chemically stable, the insulating film 415 has a higher blocking effect. The insulating film 415 that has the effect of blocking diffusion of oxygen, hydrogen, and water can be formed using a film formed of aluminum oxide, aluminum oxynitride, gallium oxide, gallium oxynitride, yttrium oxide, yttrium oxynitride, hafnium oxide, hafnium oxynitride, or the like. The insulating film 415 having an effect of blocking diffusion of hydrogen and water can be formed using a film formed of silicon nitride, silicon nitride oxide, or the like.

An insulating film 416 is provided over the insulating film 415, and the transistor 14 is provided over the insulating film 416.

The transistor 14 includes an oxide semiconductor film 420 over the insulating film 416; a conductive film 421 and a conductive film 422 that are connected to the oxide semiconductor film 420 and serve as a source and a drain; an insulating film 423 over the oxide semiconductor film 420 and the conductive films 421 and 422; and a conductive film 424 overlapping with the oxide semiconductor film 420 with the insulating film 423 positioned therebetween. An opening is provided in the insulating films 414 to 416. In the opening, the conductive film 422 is connected to the conductive film 429 that is over the insulating film 411 and is connected to the gate 428.

An insulating film 427 is provided over the conductive film 422. A conductive film 425 is provided over the insulating film 427 to overlap with the conductive film 422. A portion in which the conductive film 422, the insulating film 427, and the conductive film 425 overlap with one another serves as the capacitor 15.

An insulating film 426 is provided over the transistor 14 and the capacitor 15.

<Transistor in Memory Device>

In the memory device of one embodiment of the present invention, when the off-state current of the transistor 14 illustrated in FIG. 1 is small, the data retention time can be lengthened. Thus, the transistor 14 preferably has a channel formation region in an oxide semiconductor film.

Figure 8A:
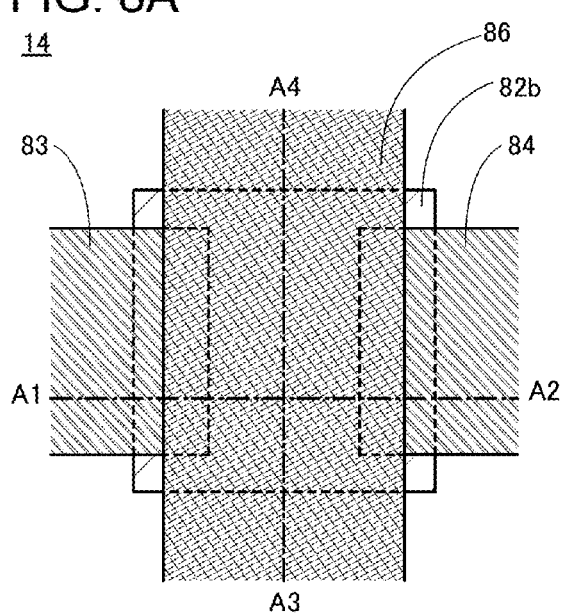
FIGS. 8A to 8C illustrate a structure of a transistor.
Figure 8C:
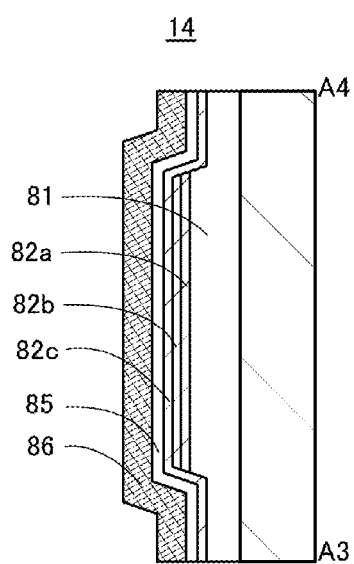
Figure 8B:
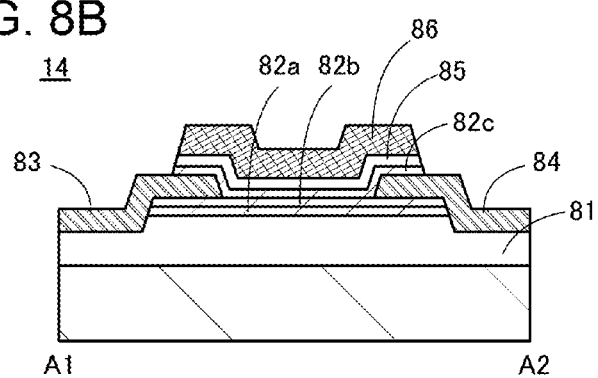

FIGS. 8A to 8C illustrate a structure example of the transistor 14 having a channel formation region in an oxide semiconductor film. FIG. 8A is a top view of the transistor 14. Note that insulating films are not illustrated in FIG. 8A in order to clarify the layout of the transistor 14. FIG. 8B is a cross-sectional view along the dashed line A1-A2 in the top view in FIG. 8A. FIG. 8C is a cross-sectional view along the dashed line A3-A4 in the top view in FIG. 8A.

As illustrated in FIGS. 8A to 8C, the transistor 14 includes an oxide semiconductor film 82a and an oxide semiconductor film 82b that are stacked in this order over an insulating film 81; a conductive film 83 and a conductive film 84 that are electrically connected to the oxide semiconductor film 82b and function as a source electrode and a drain electrode; an oxide semiconductor film 82c over the oxide semiconductor film 82b, the conductive film 83, and the conductive film 84; an insulating film 85 that functions as a gate insulating film and is located over the oxide semiconductor film 82c; and a conductive film 86 that functions as a gate electrode, lies over the insulating film 85, and overlaps with the oxide semiconductor films 82a to 82c.

Figure 9A:
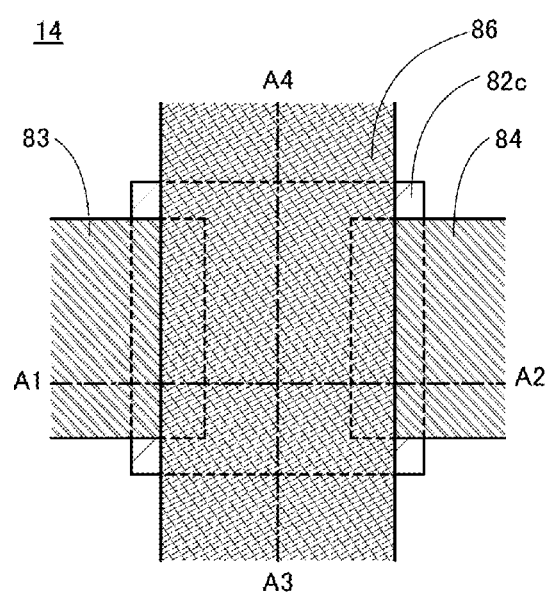
FIGS. 9A to 9C illustrate a structure of a transistor.
Figure 9C:
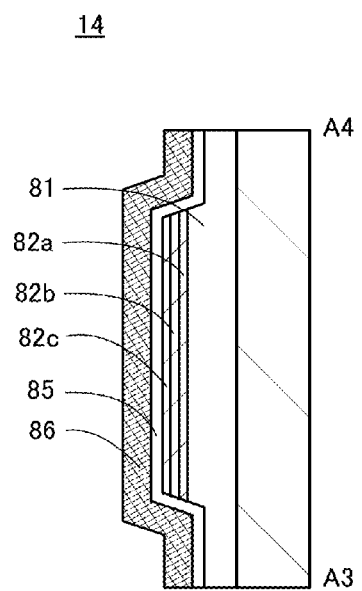
Figure 9B:
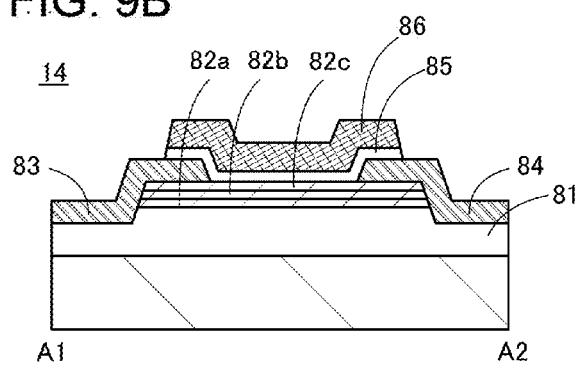

FIGS. 9A to 9C illustrates another specific example of the structure of the transistor 14. FIG. 9A is a top view of the transistor 14. Note that insulating films are not illustrated in FIG. 9A in order to clarify the layout of the transistor 14. FIG. 9B is a cross-sectional view along the dashed line A1-A2 in the top view in FIG. 9A. FIG. 9C is a cross-sectional view along the dashed line A3-A4 in the top view in FIG. 9A.

As illustrated in FIGS. 9A to 9C, the transistor 14 includes the oxide semiconductor films 82a to 82c that are stacked in this order over the insulating film 81; the conductive films 83 and 84 that are electrically connected to the oxide semiconductor film 82c and function as a source electrode and a drain electrode; the insulating film 85 that functions as a gate insulating film and is located over the oxide semiconductor film 82c, the conductive film 83, and the conductive film 84; and the conductive film 86 that functions as a gate electrode, is over the insulating film 85, and overlaps with the oxide semiconductor films 82a to 82c.

FIGS. 8A to 8C and FIGS. 9A to 9C each illustrate the structure example of the transistor 14 in which the oxide semiconductor films 82a to 82c are stacked. However, the structure of the oxide semiconductor film included in the transistor 14 is not limited to a stacked-layer structure including a plurality of oxide semiconductor films and may be a single-layer structure.

In the case where the transistor 14 includes the stacked semiconductor films, the oxide semiconductor films 82a to 82c in this order, each of the oxide semiconductor films 82a and 82c is an oxide film that contains at least one of metal elements contained in the oxide semiconductor film 82b and in which energy at the bottom of the conduction band is closer to the vacuum level than that in the oxide semiconductor film 82b is by higher than or equal to 0.05 eV, 0.07 eV, 0.1 eV, or 0.15 eV and lower than or equal to 2 eV, 1 eV, 0.5 eV, or 0.4 eV. The oxide semiconductor film 82b preferably contains at least indium because carrier mobility is increased.

In the case where the transistor 14 includes the semiconductor films with the above structure, when an electric field is applied to the semiconductor films by applying voltage to the gate electrode, a channel region is formed in the oxide semiconductor film 82b, which has the lowest conduction band minimum among the semiconductor films. That is, the oxide semiconductor film 82c provided between the oxide semiconductor film 82b and the insulating film 85 makes it possible to form the channel region in the oxide semiconductor film 82b, which is separated from the insulating film 85.

Since the oxide semiconductor film 82c contains at least one of the metal elements contained in the oxide semiconductor film 82b, interface scattering is less likely to occur at the interface between the oxide semiconductor film 82b and the oxide semiconductor film 82c. Thus, the movement of carriers is less likely to be inhibited at the interface, which results in an increase in the field-effect mobility of the transistor 14.

In the case where gallium oxide is used for the oxide semiconductor film 82c, indium in the oxide semiconductor film 82b can be prevented from being diffused into the insulating film 85; thus, the leakage current of the transistor 14 can be reduced.

When an interface level is formed at the interface between the oxide semiconductor film 82b and the oxide semiconductor film 82a, a channel region is formed also in the vicinity of the interface, which causes a change in the threshold voltage of the transistor 14. However, since the oxide semiconductor film 82a contains at least one of the metal elements contained in the oxide semiconductor film 82b, an interface level is less likely to be formed at the interface between the oxide semiconductor film 82b and the oxide semiconductor film 82a. Accordingly, the above structure allows reducing of variations in the electrical characteristics of the transistor 14, such as the threshold voltage.

Further, it is preferable that a plurality of oxide semiconductor films be stacked so that an interface level due to an impurity existing between the oxide semiconductor films, which inhibits carrier flow, is not formed at the interface between the oxide semiconductor films. This is because when an impurity exists between the stacked oxide semiconductor films, the continuity of the conduction band minimum between the oxide semiconductor films is lost, and carriers are trapped or disappear by recombination in the vicinity of the interface. By reducing an impurity existing between the films, a continuous junction (here, in particular, a U-shape well structure whose conduction band minimum is changed continuously between the films) is formed more easily than the case of merely stacking a plurality of oxide semiconductor films which contain at least one common metal as a main component.

In order to form such a continuous junction, the films need to be stacked successively without being exposed to the air by using a multi-chamber deposition system (sputtering apparatus) provided with a load lock chamber. Each chamber of the sputtering apparatus is preferably evacuated to a high vacuum (to approximately $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 82b is an In-M-Zn oxide film (M is Ga, Y, Zr, La, Ce, or Nd) and a target having the atomic ratio of metal elements of In:M:Zn=$x_1$:$y_1$:$z_1$ is used for forming the oxide semiconductor film 82b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor film 82b is easily formed. Typical examples of the atomic ratio of the metal elements of the target are In:M:Zn=1:1:1 and In:M:Zn=3:1:2.

Specifically, in the case where the oxide semiconductor films 82a and 82c contain an In-M-Zn oxide (M is Ga, Y, Zr, La, Ce, or Nd), it is preferable that $x_2/y_2 < x_1/y_1$ be satisfied and $z_2/y_2$ be greater than or equal to ⅓ and less than or equal to 6, more preferably greater than or equal to 1 and less than or equal to 6 when the atomic ratio of metal elements of In to M and Zn in a target for forming the oxide semiconductor films 82a and 82c is $x_2:y_2:z_2$. Note that when $z_2/y_2$ is greater than or equal to 1 and less than or equal to 6, CAAC-OS films as the oxide semiconductor films 82a and 82c are easily formed. Typical examples of the atomic ratio of metal elements of In to M and Zn in the target include 1:3:2, 1:3:4, 1:3:6, and 1:3:8.

The oxide semiconductor films 82a and 82c each have a thickness greater than or equal to 3 nm and less than or equal to 100 nm, preferably greater than or equal to 3 nm and less than or equal to 50 nm. The thickness of the oxide semiconductor film 82b is greater than or equal to 3 nm and less than or equal to 200 nm, preferably greater than or equal to 3 nm and less than or equal to 100 nm, more preferably greater than or equal to 3 nm and less than or equal to 50 nm.

The three oxide semiconductor films (the oxide semiconductor films 82a to 82c) can be either amorphous or crystalline. However, when the oxide semiconductor film 82b where a channel region is formed is crystalline, the transistor 14 can have stable electrical characteristics; therefore, the oxide semiconductor film 82b is preferably crystalline.

Note that a channel formation region refers to a region of the semiconductor film of the transistor 14 that overlaps with the gate electrode and is located between the source electrode and the drain electrode. A channel region refers to a region through which current mainly flows in the channel formation region.

For example, when an In—Ga—Zn oxide film formed by a sputtering method is used as each of the oxide semiconductor films 82a and 82c, the oxide semiconductor films 82a and 82c can be deposited with the use of an In—Ga—Zn oxide target containing In, Ga, and Zn in an atomic ratio of 1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, in the case where the oxide semiconductor film 82b is a CAAC-OS film, the oxide semiconductor film 82b is preferably deposited with use of a polycrystalline In—Ga—Zn-based oxide target containing In, Ga, and Zn at an atomic ratio of 1:1:1. The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor having a channel formation region in the oxide semiconductor film easily has an electrical characteristic of positive threshold voltage (also referred to as a normally-off characteristic).

Specifically, various experiments can prove small off-state current of a transistor having a channel formation region in a highly purified oxide semiconductor. For example, even when an element has a channel width of $1 \times 10^6$ μm and a channel length of 10 μm, off-state current can be less than or equal to the measurement limit of a semiconductor parameter analyzer, i.e., less than or equal to $1 \times 10^{-13}$ A, at voltage (drain voltage) between the source electrode and the drain electrode of 1 V to 10 V. In that case, it can be seen that off-state current normalized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly-purified oxide semiconductor film was used for a channel formation region of the transistor, and the off-state current of the transistor was measured from a change in the amount of charge in the capacitor per unit hour. As a result, it was found that, in the case where the voltage between the source electrode and the drain electrode of the transistor is 3 V, a lower off-state current of several tens of yA/μm is obtained. Accordingly, the off-state current of the transistor in which the purified oxide semiconductor film is used as a channel formation region is considerably lower than that of a transistor in which silicon having crystallinity is used.

In the case where an oxide semiconductor film is used as the semiconductor film, at least indium (In) or zinc (Zn) is preferably included as an oxide semiconductor film. As a stabilizer for reducing variation in electrical characteristics of a transistor using the oxide semiconductor film, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by sputtering or a wet process. Further, unlike silicon carbide, gallium nitride, or gallium oxide, with the use of the In—Ga—Zn oxide, a transistor with favorable electrical characteristics can be formed over a glass substrate. Further, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, In—Zn oxide, Sn—Zn oxide, Al—Zn oxide, Zn—Mg oxide, Sn—Mg oxide, In—Mg oxide, In—Ga oxide, In—Ga—Zn oxide (also referred to as IGZO), In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Pr—Zn oxide, In—Nd—Zn oxide, In—Ce—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide, In—Sn—Ga—Zn oxide, In—Hf—Ga—Zn oxide, In—Al—Ga—Zn oxide, In—Sn—Al—Zn oxide, In—Sn—Hf—Zn oxide, and In—Hf—Al—Zn oxide.

Note that, for example, an In—Ga—Zn oxide means an oxide containing In, Ga, and Zn and there is no particular limitation on the ratio of In:Ga:Zn. Further, the In—Ga—Zn oxide may contain a metal element other than In, Ga, and Zn. The In—Ga—Zn oxide has sufficiently high resistance when no electric field is applied thereto, so that off-state current can be sufficiently reduced. Further, the In—Ga—Zn oxide has high mobility.

For example, with an In—Sn—Zn oxide, high mobility can be realized relatively easily. However, even with an In—Ga—Zn oxide, mobility can be increased by reducing the defect density in the bulk.

Furthermore, in the transistor 14, a metal in the source electrode and the drain electrode might extract oxygen from the oxide semiconductor film depending on a conductive material used for the source electrode and the drain electrode. In this case, regions of the oxide semiconductor film in contact with the source electrode and the drain electrode become n-type regions due to the formation of oxygen vacancies. The n-type regions serve as a source region and a drain region, resulting in a decrease in the contact resistance between the oxide semiconductor film and the source electrode and between the oxide semiconductor film and the drain electrode. Accordingly, the formation of the n-type regions increases the mobility and on-state current of the transistor 14, achieving the high-speed operation of a memory device using the transistor 14.

Note that the extraction of oxygen by a metal in the source electrode and the drain electrode is probably caused when the source electrode and the drain electrode are formed by a sputtering method or the like or when heat treatment is performed after the formation of the source electrode and the drain electrode. The n-type regions are more likely to be formed by forming the source electrode and the drain electrode with the use of a conductive material that is easily bonded to oxygen. Examples of such a conductive material include Al, Cr, Cu, Ta, Ti, Mo, and W.

Furthermore, in the case where the semiconductor film including the stacked oxide semiconductor films is used in the transistor 14, the regions having n-type conductivity preferably extend to the oxide semiconductor film 82b serving as a channel region in order that the mobility and on-state current of the transistor 14 can be further increased and the memory device can operate at higher speed.

The insulating film 81 preferably has a function of supplying part of oxygen to the oxide semiconductor films 82a to 82c by heating. It is preferable that the number of defects in the insulating film 81 be small, and typically the spin density of g=2.001 due to a dangling bond of silicon be lower than or equal to $1 \times 10^{18}$ spins/cm$^3$. The spin density is measured by ESR spectroscopy.

The insulating film 81, which has a function of supplying part of the oxygen to the oxide semiconductor films 82a to 82c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 81 can be formed by a plasma chemical vapor deposition (CVD) method, a sputtering method, or the like.

Note that in this specification, oxynitride contains more oxygen than nitrogen, and nitride oxide contains more nitrogen than oxygen.

Note that in the transistor 14 illustrated in FIGS. 8A to 8C and FIGS. 9A to 9C, the conductive film 86 overlaps with end portions of the oxide semiconductor film 82b including a channel region that do not overlap with the conductive films 83 and 84, i.e., end portions of the oxide semiconductor film 82b that are in a region different from a region where the conductive films 83 and 84 are located. When the end portions of the oxide semiconductor film 82b are exposed to plasma by etching for forming the end portions, chlorine radical, fluorine radical, or the like generated from an etching gas is easily bonded to a metal element contained in the oxide semiconductor. For this reason, in the end portions of the oxide semiconductor film, oxygen bonded to the metal element is easily eliminated, so that an oxygen vacancy is easily formed; thus, the oxide semiconductor film easily has n-type conductivity. However, an electric field applied to the end portions can be adjusted by controlling the potentials of the conductive film 86 because the end portions of the oxide semiconductor film 82b that do not overlap with the conductive films 83 and 84 overlap with the conductive film 86 in the transistor 14 illustrated in FIGS. 8A to 8C and FIGS. 9A to 9C. Consequently, the flow of current between the conductive films 83 and 84 through the end portions of the oxide semiconductor film 82b can be controlled by the potential supplied to the conductive film 86. Such a structure of the transistor 14 is referred to as a surrounded channel (s-channel) structure.

With the s-channel structure, specifically, when a potential at which the transistor 14 is turned off is supplied to the conductive film 86, the amount of off-state current that flows between the conductive films 83 and 84 through the end portions of the oxide semiconductor film 82b can be reduced. For this reason, in the transistor 14, even when the distance between the conductive films 83 and 84 at the end portions of the oxide semiconductor film 82b is reduced as a result of reducing the channel length to obtain high on-state current, the transistor 14 can have low off-state current. Consequently, with the short channel length, the transistor 14 can have high on-state current when in an on state and low off-state current when in an off state.

With the s-channel structure, specifically, when a potential at which the transistor 14 is turned on is supplied to the conductive film 86, the amount of current that flows between the conductive films 83 and 84 through the end portions of the oxide semiconductor film 82b can be increased. The current contributes to an increase in the field-effect mobility and an increase in on-state current of the transistor 14. When the end portions of the oxide semiconductor film 82b overlap with the conductive film 86, carriers flow in a wide region of the oxide semiconductor film 82b without being limited to a region in the vicinity of the interface between the oxide semiconductor film 82b and the insulating film 85, which results in an increase in carrier mobility the transistor 14. As a result, the on-state current of the transistor 14 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is an index of current drive capability and the apparent field-effect mobility of a saturation region of the transistor.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. When a combined analysis image (also referred to as a high-resolution TEM image) of a bright-field image and a diffraction pattern of the CAAC-OS film is observed by a transmission electron microscope (TEM), a plurality of crystal parts are seen. However, in the high-resolution TEM image, a boundary between crystal parts, i.e., a grain boundary is not observed clearly. Thus, in the CAAC-OS film, a reduction in electron mobility due to the grain boundary is less likely to occur.

In the high-resolution cross-sectional TEM image of the CAAC-OS film observed in a direction substantially parallel to the sample surface, metal atoms arranged in a layered manner are seen in the crystal parts. Each metal atom layer has a shape that reflects a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, a term "perpendicular" indicates that the angle formed between two straight lines is greater than or equal to 80° and less than or equal to 100°, and accordingly includes the case where the angle is greater than or equal to 85° and less than or equal to 95°. A term "substantially perpendicular" indicates that the angle formed between two straight lines is greater than or equal to 60° and less than or equal to 120°.

On the other hand, according to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

From the results of the high-resolution cross-sectional TEM observation and the high-resolution plan-view TEM observation, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

In a transistor including the CAAC-OS film, a change in electrical characteristics due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

For the deposition of the CAAC-OS film, the following conditions are preferably used.

By reducing the amount of impurities entering the CAAC-OS layer during the deposition, the crystal state can be prevented from being broken by the impurities. For example, the concentration of impurities (e.g., hydrogen, water, carbon dioxide, and nitrogen) that exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like or pellet-like sputtered particle reaches the substrate, migration occurs on the substrate surface, so that a flat plane of the sputtered particles is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the target, an In—Ga—Zn oxide target is described below.

The In—Ga—Zn oxide target, which is polycrystalline, is made as follows: $InO_X$ powder, $GaO_Y$ powder, and $ZnO_Z$ powder are mixed in a predetermined molar ratio, pressure is applied to the mixture, and heat treatment is performed at a temperature from 1000° C. to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired target.

An alkali metal is not an element included in an oxide semiconductor and thus is an impurity. Also, alkaline earth metal is an impurity in the case where the alkaline earth metal is not a component of the oxide semiconductor. Alkali metal, in particular, Na becomes $Na^+$ when an insulating film in contact with the oxide semiconductor film is an oxide and Na diffuses into the insulating film. Further, in the oxide semiconductor film, Na cuts or enters a bond between metal and oxygen that are included in the oxide semiconductor. As a result, for example, degradation of electrical characteristics of a transistor, such as a normally-on state of the transistor due to shift of the threshold voltage in the negative direction or reduction in mobility, occurs. In addition, variations in electrical characteristics also occur. Specifically, the Na concentration according to secondary ion mass spectrometry is reduced to preferably less than or equal to $5 \times 10^{16}/cm^3$, further preferably less than or equal to $1 \times 10^{16}/cm^3$, still further preferably less than or equal to $1 \times 10^{15}/cm^3$.

In a similar manner, the measurement value of Li concentration is preferably less than or equal to $5 \times 10^{15}/cm^3$, more preferably less than or equal to $1 \times 10^{15}/cm^3$. In a similar manner, the measurement value of K concentration is preferably less than or equal to $5 \times 10^{15}/cm^3$, more preferably less than or equal to $1 \times 10^{15}/cm^3$.

In the case where a metal oxide containing indium is used, silicon or carbon having higher bond energy with oxygen than indium might cut the bond between indium and oxygen, so that an oxygen vacancy is formed. Accordingly, when silicon or carbon is contained in the oxide semiconductor film, the electrical characteristics of the transistor are likely to deteriorate as in the case of using an alkali metal or an alkaline earth metal. Thus, the concentration of silicon and the concentration of carbon in the oxide semiconductor film are preferably low. Specifically, the carbon concentration or the silicon concentration measured by secondary ion mass spectrometry is preferably less than or equal to $1 \times 10^{18}/cm^3$. In that case, the deterioration of the electrical characteristics of the transistor can be prevented, so that the reliability of the memory device can be improved.

<Structure of Chip>

Figure 10A:
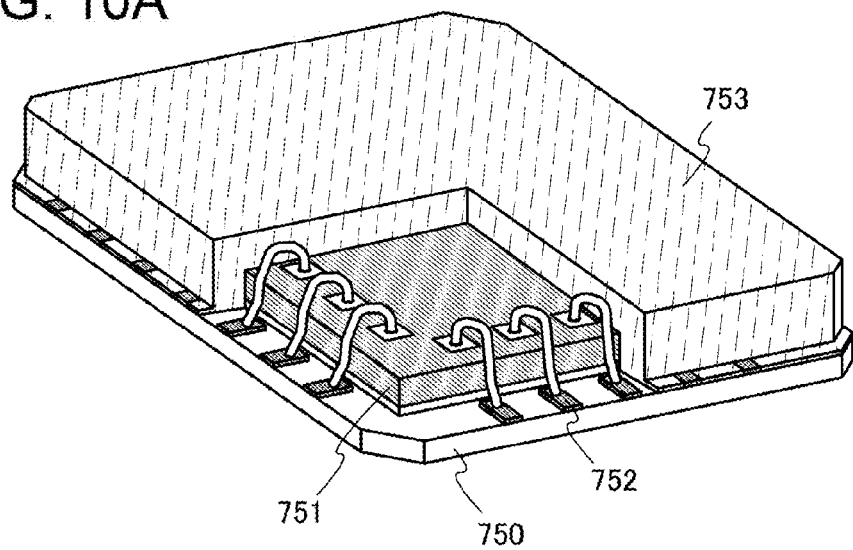
FIGS. 10A and 10B illustrate a chip and a module.

FIG. 10A is a perspective view illustrating a cross-sectional structure of a package using a lead frame interposer.

In the package illustrated in FIG. 10A, a chip 751 corresponding to the semiconductor device of one embodiment of the present invention is connected to a terminal 752 over an interposer 750 by a wire bonding method. The terminal 752 is placed on a surface of the interposer 750 on which the chip 751 is mounted. The chip 751 can be sealed by a mold resin 753, in which case the chip 751 is sealed so that part of each of the terminals 752 is exposed.

Figure 10B:
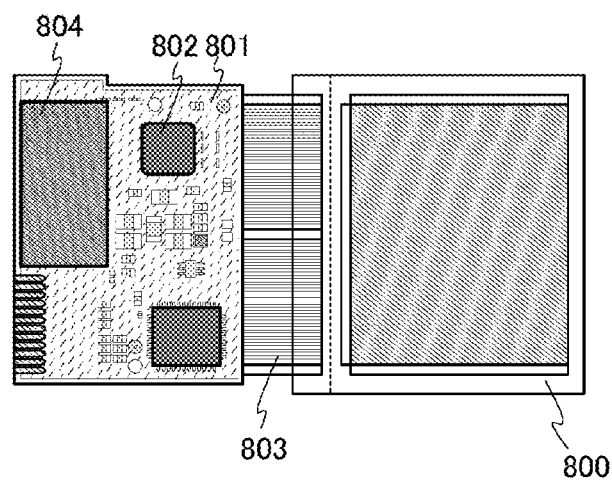

FIG. 10B illustrates the structure of a module of an electronic device in which the package is mounted on a circuit board.

In the module of a mobile phone illustrated in FIG. 10B, a package 802 and a battery 804 are mounted on a printed wiring board 801. In addition, the printed wiring board 801 is mounted on a panel 800 including a display element by an FPC 803.

<Examples of Electronic Devices>

The memory device or the semiconductor device of one embodiment of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can include the memory device or the semiconductor device of one embodiment of the present invention are mobile phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of these electronic devices are illustrated in FIGS. 11A to 11F.

Figure 11A:
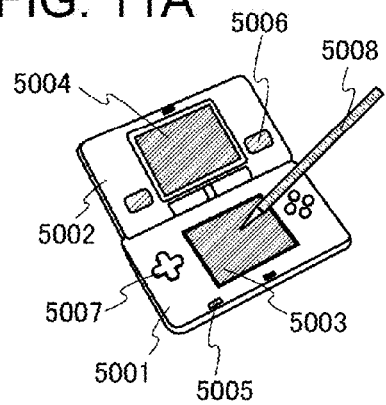
FIGS. 11A to 11F illustrate electronic devices.

FIG. 11A illustrates a portable game machine, which includes a housing 5001, a housing 5002, a display portion 5003, a display portion 5004, a microphone 5005, speakers 5006, a control key 5007, a stylus 5008, and the like. The memory device or the semiconductor device of one embodiment of the present invention can be used for a variety of integrated circuits included in the portable game machine.

Note that although the portable game machine in FIG. 11A has the two display portions 5003 and 5004, the number of display portions included in the portable game machine is not limited thereto.

Figure 11B:
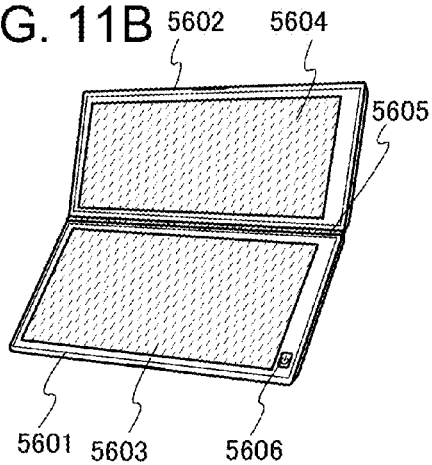

FIG. 11B illustrates a portable information terminal, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602 at the joint 5605. The memory device or the semiconductor device of one embodiment of the present invention can be used for a variety of integrated circuits included in the portable information terminal. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel area of a display device.

Figure 11C:
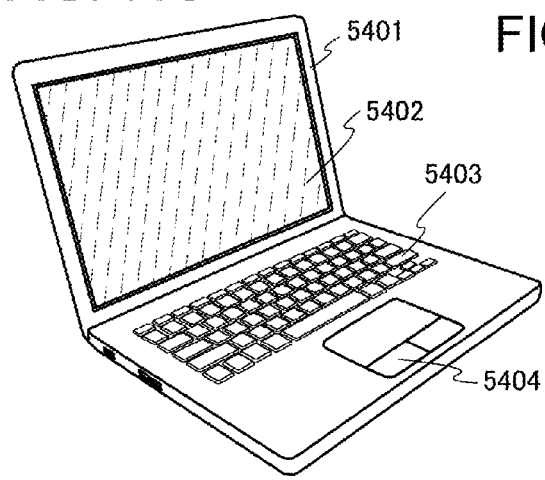

FIG. 11C illustrates a notebook personal computer, which includes a housing 5401, a display portion 5402, a keyboard 5403, a pointing device 5404, and the like. The memory device or the semiconductor device of one embodiment of the present invention can be used for a variety of integrated circuits included in the notebook personal computer.

Figure 11D:
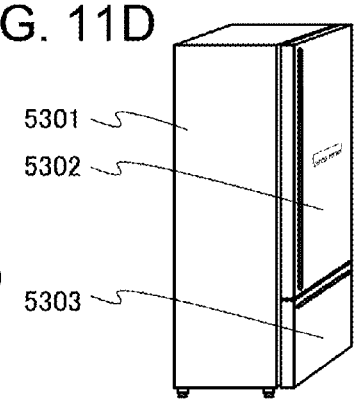

FIG. 11D illustrates an electric refrigerator-freezer, which includes a housing 5301, a door for a refrigerator 5302, a door for a freezer 5303, and the like. The memory device or the semiconductor device of one embodiment of the present invention can be used for a variety of integrated circuits included in the electric refrigerator-freezer.

Figure 11E:
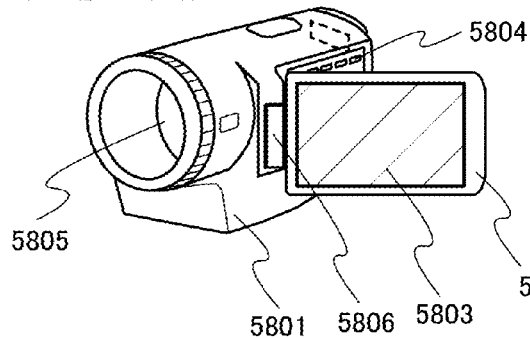

FIG. 11E illustrates a video camera, which includes a first housing 5801, a second housing 5802, a display portion 5803, operation keys 5804, a lens 5805, a joint 5806, and the like. The operation keys 5804 and the lens 5805 are provided for the first housing 5801, and the display portion 5803 is provided for the second housing 5802. The memory device or the semiconductor device of one embodiment of the present invention can be used for a variety of integrated circuits included in the video camera. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 11F:
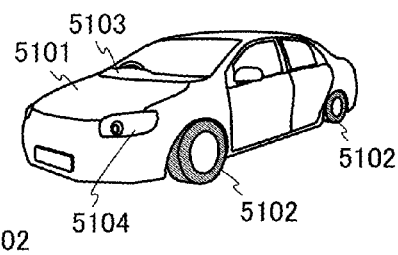

FIG. 11F illustrates a motor vehicle, which includes a car body 5101, wheels 5102, a dashboard 5103, lights 5104, and the like. The memory device or the semiconductor device of one embodiment of the present invention can be used for a variety of integrated circuits included in the motor vehicle.

Example 1

<Temperature Dependence>

Next, the calculation results of the temperature dependence of the speed of various operations of the memory device of one embodiment of the present invention are described.

The temperature dependence of the operation speed was calculated using the memory device 10 illustrated in FIG. 3. Specifically, the following were calculated: the temperature dependence of the time (data backup time) required for data backup from the first memory circuit 11 to the second memory circuit 12; the temperature dependence of the time (data recovery time) required for data recovery from the second memory circuit 12 to the first memory circuit 11; and the temperature dependence of the time (retention time) required for data retention in the second memory circuit 12.

In the calculation, the temperature was assumed to be −40° C., 27° C., and 125° C. For the calculation, circuit simulation software Gateway (manufactured by Silvaco, Inc.) was used.

Figure 12:
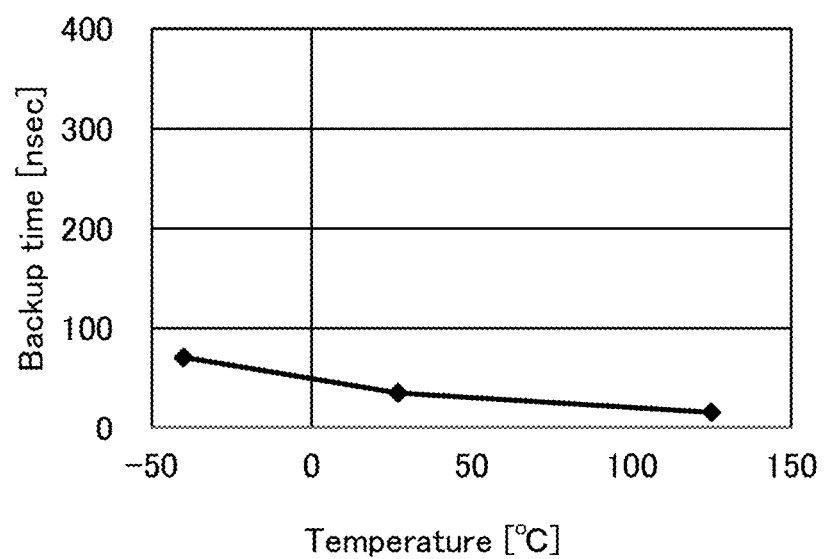
FIG. 12 shows the results of calculation of temperature dependence of data backup time in a memory device.

FIG. 12 is a graph showing a relation between temperature and data backup time, which was obtained by the calculation. Table 1 shows calculated data backup time with respect to temperature.

TABLE 1

| Temperature (° C.) | Data backup time (nsec.) |
|---|---|
| −40 | 71 |
| 27 | 35 |
| 125 | 16 |

Figure 13:
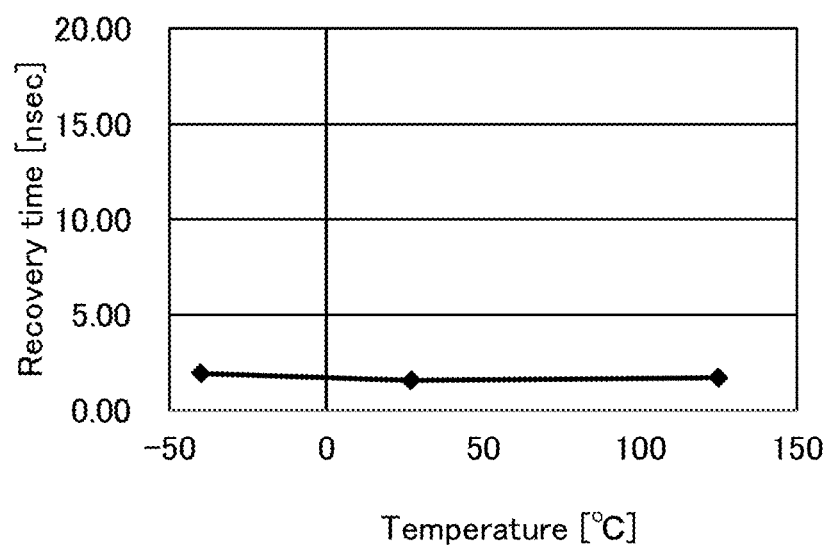
FIG. 13 shows the results of calculation of temperature dependence of data recovery time in a memory device.

FIG. 13 is a graph showing a relation between temperature and data recovery time, which was obtained by the calculation. Table 2 shows calculated data recovery time with respect to temperature.

TABLE 2

| Temperature (° C.) | Data recovery time (nsec.) |
|---|---|
| −40 | 1.93 |
| 27 | 1.57 |
| 125 | 1.71 |

Figure 14:
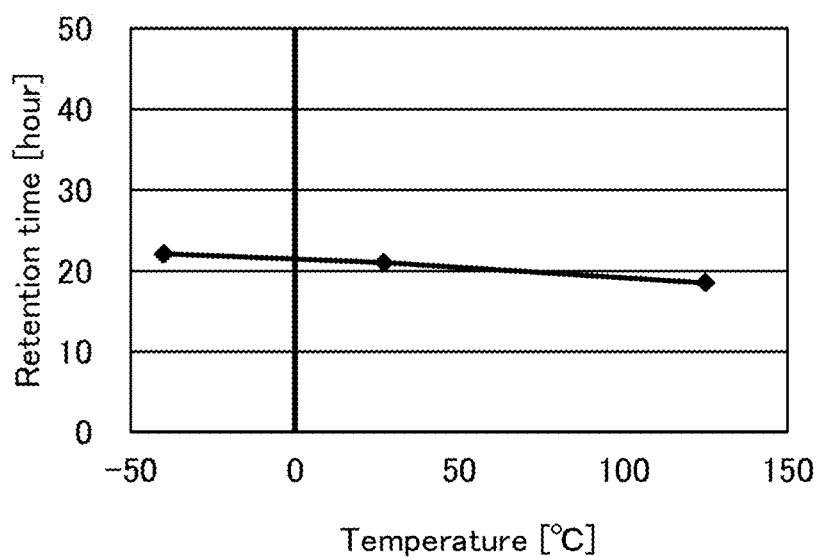
FIG. 14 shows the results of calculation of temperature dependence of data retention time in a memory device.

FIG. 14 is a graph showing a relation between temperature and retention time, which was obtained by the calculation. Table 2 shows calculated retention time with respect to temperature.

TABLE 3

| Temperature (° C.) | Retention time (hour) |
|---|---|
| −40 | 22.1 |
| 27 | 21.1 |
| 125 | 18.6 |

FIG. 12 and Table 1 show that data backup time tends to be shorter as temperature is higher. FIG. 13 and Table 2 show no temperature dependence of data recovery time. FIG. 14 and Table 3 show that retention time tends to be shorter as temperature is higher, but the temperature dependence is small.

<Power Consumption of Semiconductor Device>

Next, a configuration of a designed semiconductor device and the simulated power consumption of the semiconductor device are described.

Figure 15:
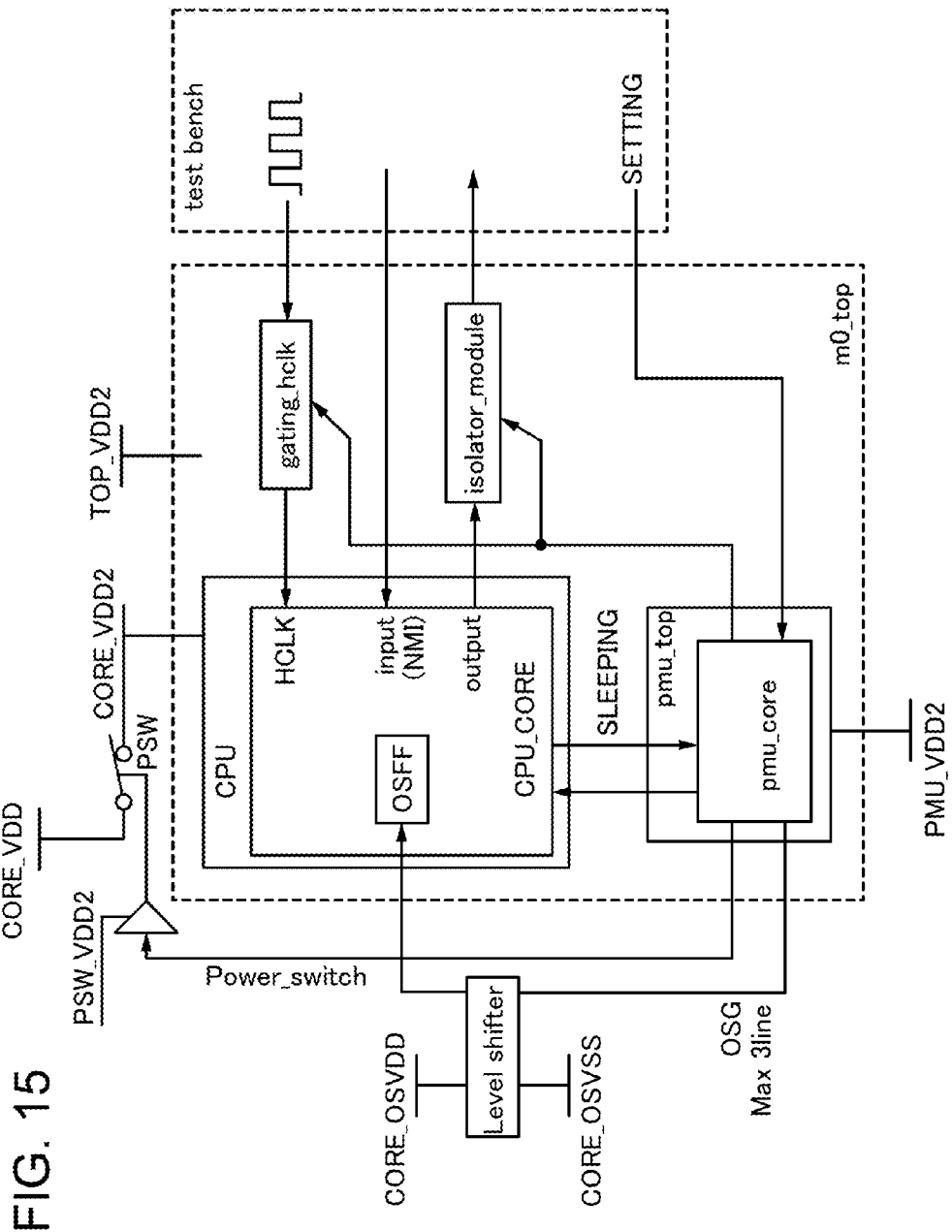
FIG. 15 illustrates a configuration of a semiconductor device.

FIG. 15 is a block diagram illustrating the configuration of the designed semiconductor device. A semiconductor device (m0_top) illustrated in FIG. 15 includes a CPU, a power management unit (pmu_top), a clock gating module (gating_hclk), and an isolator module (isolator_module). The CPU includes a CPU core (CPU_CORE) for executing various instructions. In the CPU core (CPU_CORE), a memory (OSFF) including the memory device 10 illustrated in FIG. 3 is used. The power management unit (pmu_top) includes a power management unit core (pmu_core) for processing various signals input to the power management unit (pmu_top).

A power switch (PSW) and a level shifter (Level shifter) are separately provided outside the semiconductor device (m0_top).

A test bench (test bench) has a function of controlling the operation of the semiconductor device (m0_top). Specifically, the test bench (test bench) includes a RAM, a BUS SLAVE, and the like and has a function of, for example, sending various instructions to the semiconductor device (m0_top).

The test bench (test bench) has a function of sending a signal SETTING to the power management unit core. The signal SETTING has a function of setting the operation timing of power gating, for example. The power management unit core has a function of outputting a signal Power_switch. The signal Power_switch is input to the power switch (PSW) through a buffer. The buffer is supplied with a potential PSW_VDD2. The signal Power_switch has a function of controlling the power switch (PSW). The power management unit core has a function of outputting the signal OSG. The signal OSG is input to the memory (OSFF) through the level shifter. The level shifter is supplied with a potential CORE_OSVDD and a potential CORE_OSVSS. The CPU core has a function of sending a signal SLEEPING to the power management unit core. The signal SLEEPING shows whether the CPU core is in a resting state or not.

Figure 16A:
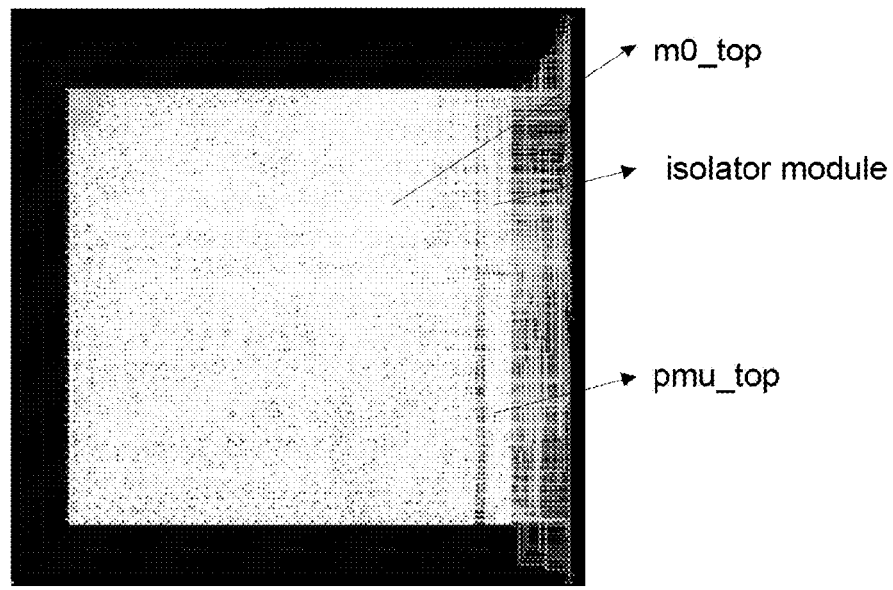
FIGS. 16A and 16B show layouts of masks for semiconductor devices.
Figure 16B:
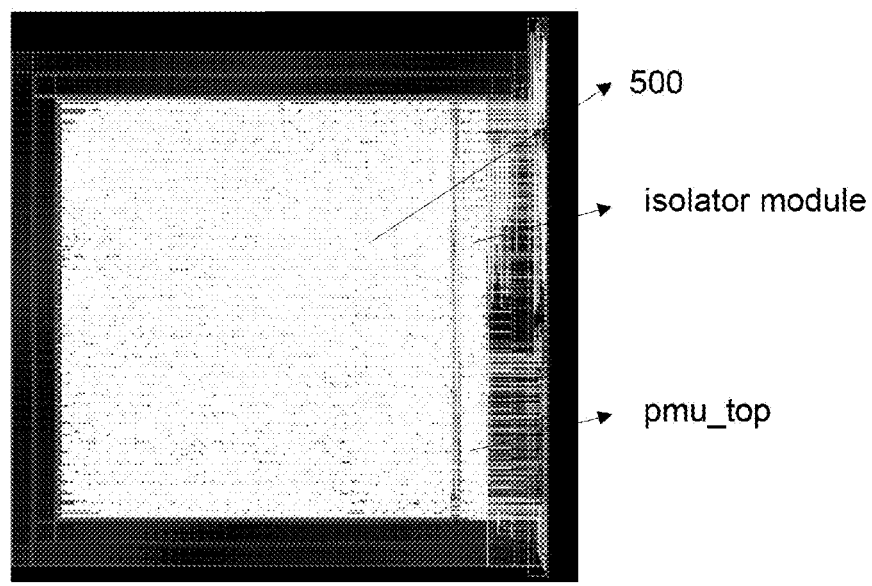

FIG. 16A shows the layout of a mask for designing the semiconductor device (m0_top). As a comparative example, FIG. 16B shows the layout of a mask for designing a semiconductor device 500 that has a configuration different from that of the semiconductor device (m0_top) in that the second memory circuit 12 illustrated in FIG. 3 is not included in the memory (OSFF). The semiconductor device (m0_top) shown in FIG. 16A has a size of 277.77 μm×274.16 μm and a standard cell density of 63.714%. The semiconductor device 500, which is a comparative example shown in FIG. 16B, has a size of 262.95 μm×259.34 μm and a standard cell density of 65.190%.

Table 4 shows specifications of the semiconductor device (m0_top) and the semiconductor device 500. Note that in the specifications of Table 4, the power supply voltage 2.5 V for the semiconductor device (m0_top) is supplied to the memory (OSFF). Specifically, 2.5 V of the power supply voltage is used for the signal OSG shown in FIG. 3.

TABLE 4

| | Semiconductor device (m0_top) | Semiconductor device 500 |
| --- | --- | --- |
| Si-FET gate length | 45 nm | 45 nm |
| OS-FET gate length | 100 nm | NA |
| Clock frequency | 50 MHz | 50 MHz |
| Power supply voltage | 1.1 V and 2.5 V | 1.1 V |
| Gate count | 8795 + PMU:398 | 8870 |
| Number of FFs | 841 | 841 |

TABLE 4-continued

| | Semiconductor device (m0_top) | Semiconductor device 500 |
| --- | --- | --- |
| Area | 277.77 μm × 274.16 μm | 262.95 μm × 259.34 μm |
| Number of metal layers | 5 | 5 |

As shown in FIGS. 16A and 16B, the layout area of the mask of the semiconductor device (m0_top) is 111.1% of that of the semiconductor device 500, that is, the area overhead is 11.1%.

The semiconductor device (m0_top) differs from the semiconductor device 500 in that the semiconductor device (m0_top) includes the second memory circuit 12. With the existence of the second memory circuit 12, the area of the semiconductor device (m0_top) is greater than that of the semiconductor device 500. However, as shown in FIGS. 16A and 16B, an increase in area of the semiconductor device (m0_top) from the semiconductor device 500 is small.

Next, the measurement results of the current consumption during normal operation without power gating of the semiconductor device (m0_top) and the semiconductor device 500 are described. The current consumption was measured in the state where the semiconductor device (m0_top) and the semiconductor device 500 each operated under the conditions where the temperature was room temperature (27° C.), the power supply voltage was 1.1 V, and the frequency of a clock signal HCLK was 50 MHz. Note that the power supply voltage corresponds to a potential difference between a potential CORE_VDD and the potential CORE_OSVSS in FIG. 15.

Figure 17A:
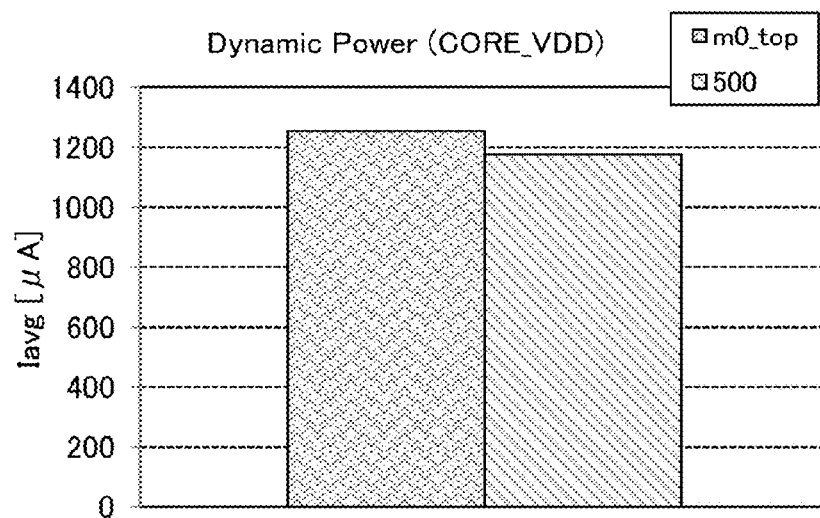
FIGS. 17A and 17B show the simulation results of the current consumption of a semiconductor device.

FIG. 17A shows the current consumption of the semiconductor device (m0_top) and the semiconductor device 500 that were each calculated from a current value obtained by simulation of current flowing through a wiring to which the potential CORE_VDD was supplied. For the calculation, circuit simulation software NanoSim (manufactured by Synopsys, Inc.) was used. The potential CORE_VDD is a potential supplied to the CPU through the power switch PSW; thus, the current consumption shown in FIG. 17A does not include the current consumption of the power management unit (pmu_top), the clock gating module (gating_hclk), and the isolator module (isolator_module).

Figure 17B:
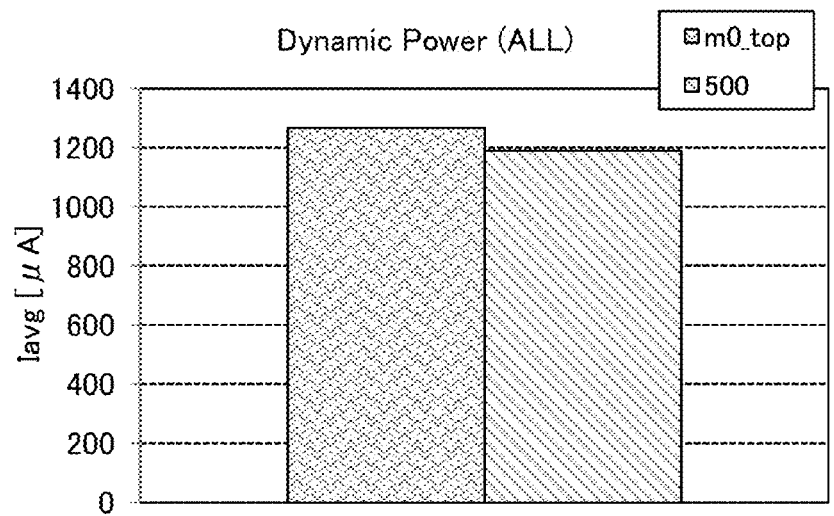

FIG. 17B shows the current consumption of all power domains of the semiconductor device (m0_top) and the semiconductor device 500.

According to the comparison of the current consumption between the semiconductor device (m0_top) and the semiconductor device 500 in the FIG. 17A and the comparison of current consumption between the semiconductor device (m0_top) and the semiconductor device 500 in the FIG. 17B, it is found that in the normal operation, the current consumption of the semiconductor device (m0_top) is higher than that of the semiconductor device 500 by approximately 6% on average, but the difference is small.

By the comparison of the current consumption of the semiconductor device (m0_top) between FIG. 17A and FIG. 17B, it is found that the current consumption of the power management unit (pmu_top), the clock gating module (gating_hclk), and the isolator module (isolator_module) is very small. The same tendency is confirmed by the comparison of the current consumption between the semiconductor device 500 in FIG. 17A and the semiconductor device 500 in FIG. 17B.

Figure 18:
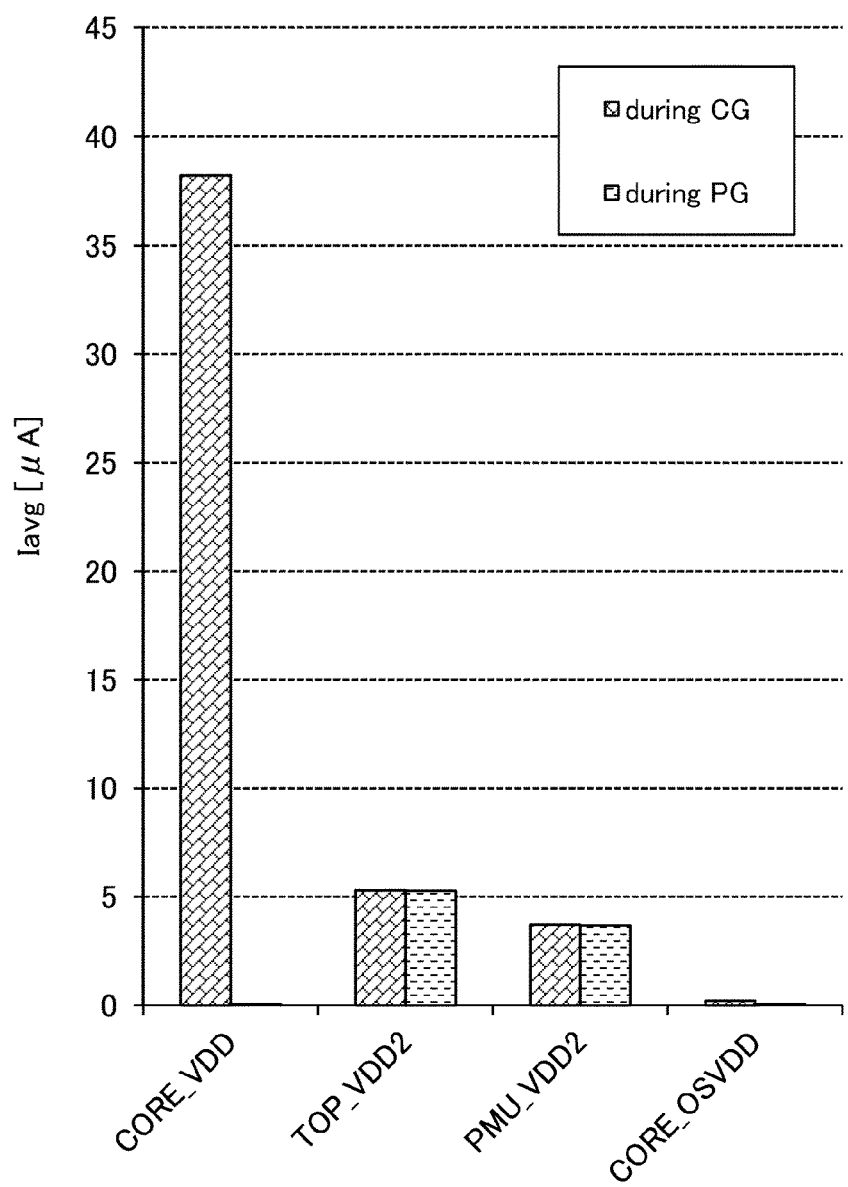
FIG. 18 is a graph showing the simulation results of the current consumption during clock gating and power gating.

Next, the simulation results of the current consumption of the semiconductor device (m0_top) in which clock gating (CG) is performed and the current consumption of the semiconductor device (m0_top) in which power gating (PG) is performed are described. For the simulation, circuit simulation software NanoSim (manufactured by Synopsys, Inc.) was used. FIG. 18 shows the simulation results of the current consumption. The simulation was performed on the assumption that the frequency of the clock signal HCLK was 50 MHz. The calculation was performed on the assumption that 1.21 V of the power supply voltage was supplied to the semiconductor device (m0_top) at the time of power supply. Furthermore, the current consumption was calculated on the assumption that the substrate temperature was 125° C., and that the threshold voltage of a p-channel transistor using silicon (SiFET) was shifted in the positive direction and the threshold voltage of an n-channel transistor using silicon (SiFET) was shifted in the negative direction, so that the transistors were both normally-on.

Specifically, the current consumption was measured at a wiring to which the potential CORE_VDD was supplied, a wiring to which a potential TOP_VDD2 was supplied, a wiring to which a potential PMU_VDD2 was supplied, and a wiring to which the potential CORE_OSVDD was supplied. FIG. 18 shows the current consumption measured at these wirings. As shown in FIG. 18, in the case of the wiring to which the potential TOP_VDD2 was supplied, the wiring to which a potential PMU_VDD2 was supplied, and the wiring to which the potential CORE_OSVDD was supplied, there is no significant difference between the current consumption in the case where the clock gating (CG) was performed and the current consumption in the case where the power gating (PG) was performed. In contrast, in the case of the wiring to which the potential CORE_VDD was supplied, the current consumption in the case where the power gating (PG) was performed is much lower than that in the case where the clock gating (CG) was performed. That is, in one embodiment of the present invention, leakage current can be markedly reduced by power gating.

Figure 19:
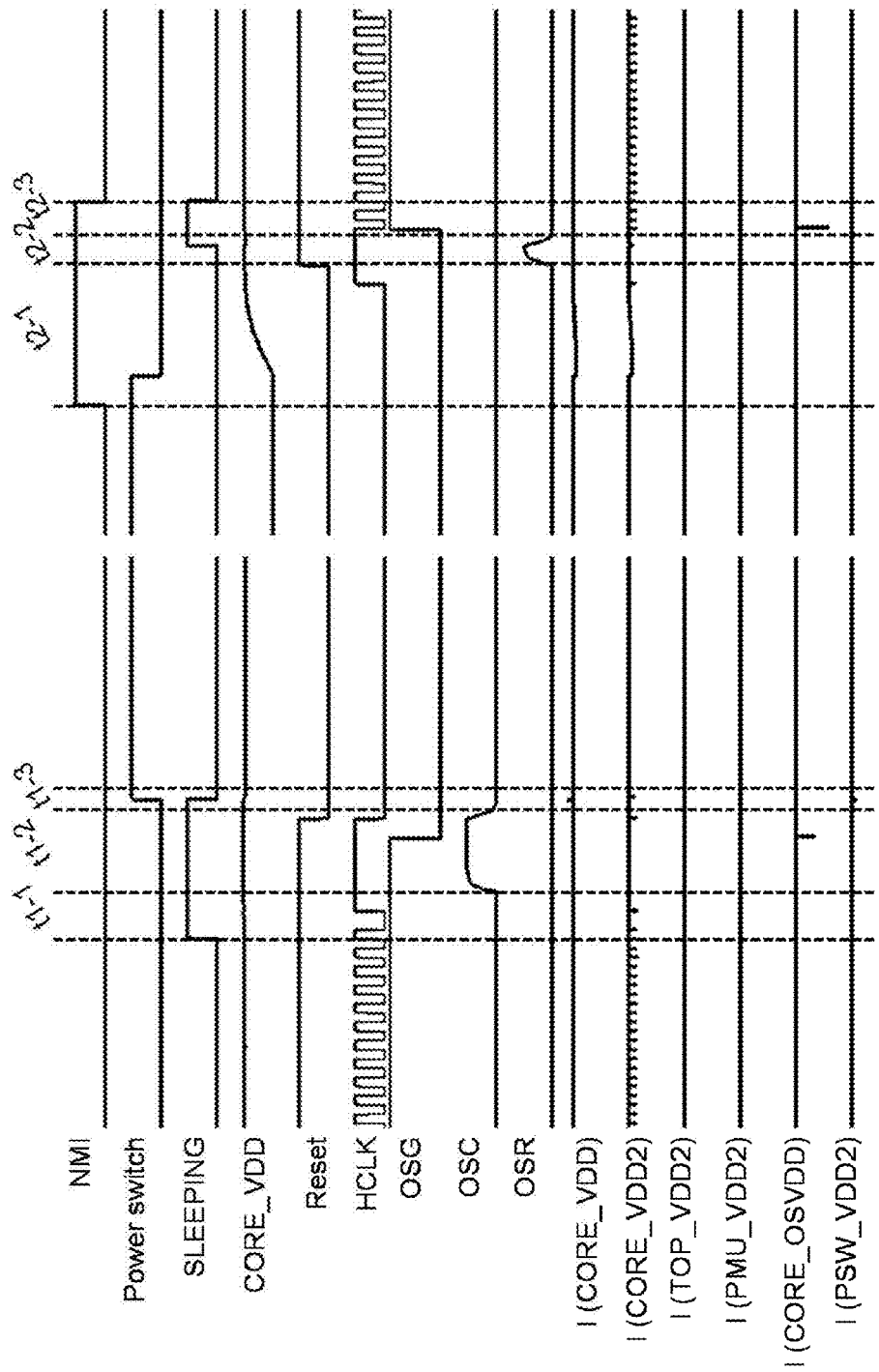
FIG. 19 is a timing diagram of potentials during power gating and shows a change in current consumption.
Figure 20:
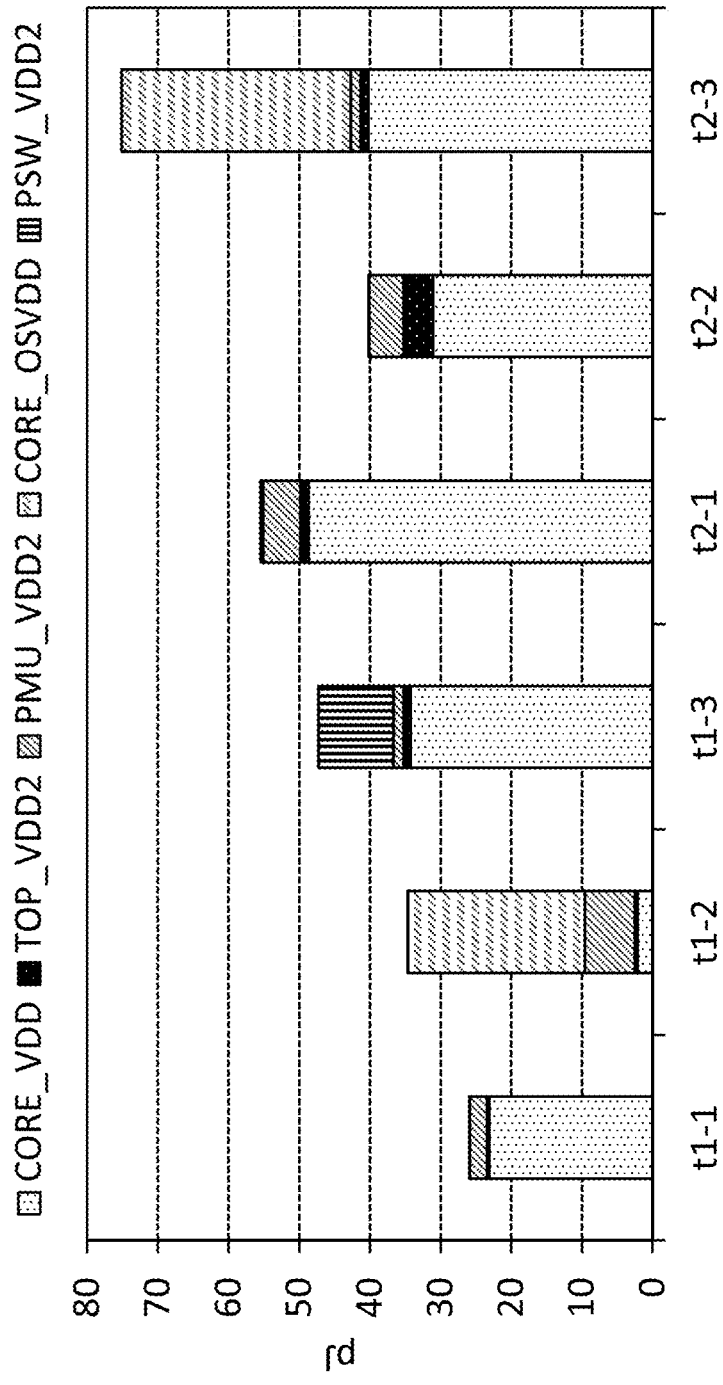
FIG. 20 is a graph showing the calculation results of energy (pJ) consumption corresponding to current flowing through each wiring.

Next, the simulation results of the detailed breakdown of the energy consumption of the semiconductor device (m0_top) in which the power gating (PG) is performed are described. For the calculation, circuit simulation software NanoSim (manufactured by Synopsys, Inc.) was used. FIG. 19 is a timing diagram of potentials during the power gating (PG) and shows a change in current consumption of wirings that can supply the potentials. FIG. 20 is a graph showing the calculation results of energy (pJ) consumption corresponding to current flowing through the wirings at Time t1-1, Time t1-2, Time t1-3, Time t2-1, Time t2-2, Time t2-3 in the case of performing the power gating (PG) in FIG. 19. The specific energy (pJ) consumption obtained by the calculation is shown in Table 5.

TABLE 5

|  | t1-1 | t1-2 | t1-3 | t2-1 | t2-2 | t2-3 |
|---|---|---|---|---|---|---|
| CORE_VDD(pJ) | 23.16 | 2.14 | 34.28 | 48.72 | 31.10 | 40.26 |
| TOP_VDD2(pJ) | 0.30 | 0.42 | 0.98 | 1.15 | 4.19 | 1.06 |
| PMU_VDD2(pJ) | 2.46 | 7.04 | 1.45 | 5.29 | 4.84 | 1.43 |
| CORE_OSVDD(pJ) | 0.00 | 25.05 | 0.00 | 0.00 | 0.00 | 32.36 |
| PSW_VDD2(pJ) | 0.00 | 0.00 | 10.58 | 0.32 | 0.00 | 0.00 |

Example 2

In this example, a chip on which a cache and a CPU core were mounted was fabricated. The cache includes a transistor (OSFET) which has a channel length of 60 nm and which has a channel formation region in a CAAC-OS film of In—Ga—Zn oxide. The CPU core includes a flip-flop (OSFF) including an OSFET and the second memory circuit 12.

Figure 25:
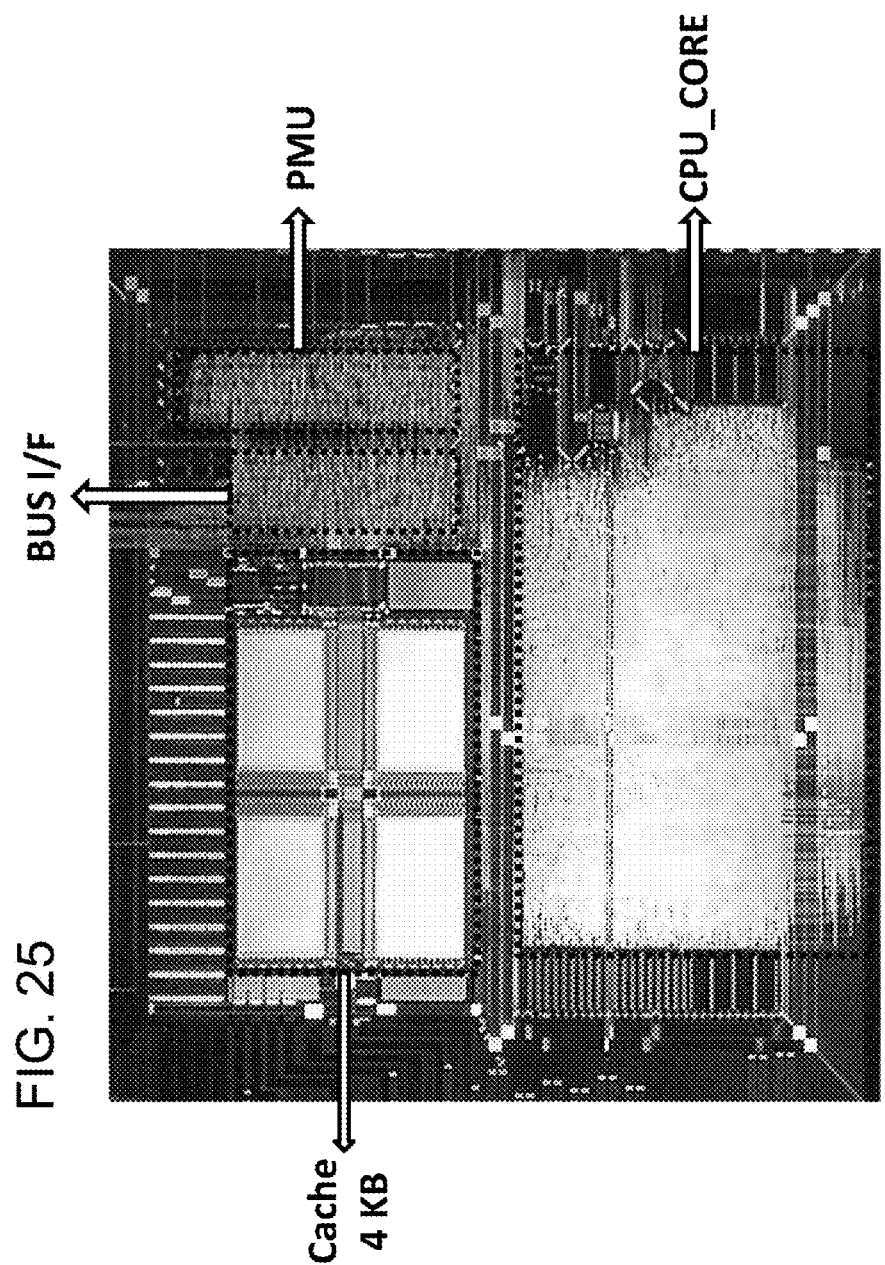
FIG. 25 is a photograph of a fabricated chip.

FIG. 25 and Table 6 show the photograph and the specifications of the fabricated chip, respectively. The fabricated chip includes a CPU core (CPU_CORE) using Cortex-M0 (registered trademark) manufactured by ARM Ltd., a 4-KB cache (Cache), a bus interface (Bus I/F), and a power management unit (PMU). A data retention circuit including an OSFET is mounted on the cache. Thus, the cache can back up data during power gating.

TABLE 6

| Circuits | Cortex-M0 (Design start), Cache (4 Kbyte), Power management unit, Bus interface, Power switch, Level shifter | |
|---|---|---|
| Frequency | 30 MHz | |
| Chip size | 7.2 mm × 7.2 mm | |
| | OSFET | SiFET |
| Technology | 60 nm | 180 nm |
| Number of CPU_CORE transistors | 841 | ≈90,000 |
| Cache | 65,536 | ≈221,000 |
| Other | — | ≈26,700 |
| Power supply voltage | 2.5 V/−1 V | 1.8 V |

Figure 35:
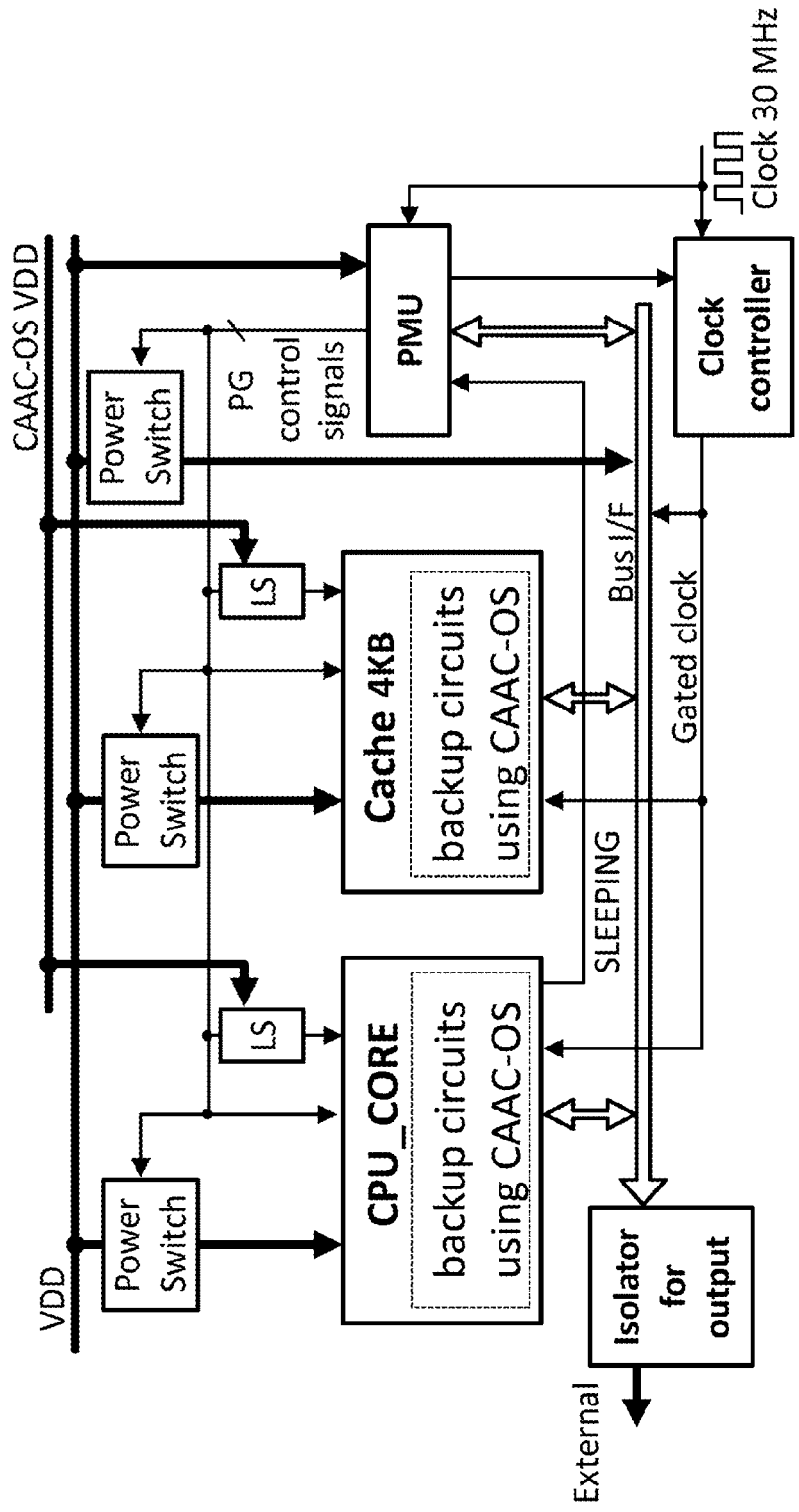
FIG. 35 is a block diagram of a fabricated chip.

The configuration of the fabricated chip is described in further detail with reference to FIG. 35. FIG. 35 shows a block diagram of the fabricated chip. The fabricated chip includes the CPU core (CPU_CORE) using Cortex-M0 (registered trademark) manufactured by ARM Ltd., the 4-KB cache (Cache), the power management unit (PMU), a clock control circuit (Clock controller), an isolator (Isolator for output), power switches (Power Switch), level shifters (LS), and the bus interface (Bus I/F). A data retention circuit in which data backup during power gating is realized by the use of an OSFET is mounted on each of the cache and the CPU core.

The power switches control the supply of the power supply voltage in accordance with control signals (PG control signals) input from the power management unit. A power switch for controlling the supply of the power supply voltage to the CPU core, a power switch for controlling the supply of the power supply voltage to the cache, and a power switch for controlling the supply of the power supply voltage to the bus interface are provided. The level shifter shifts the level of a signal for controlling the OSFET. The level shifter is provided because the power supply voltage (2.5 V) supplied to the OSFET is higher than the power supply voltage (1.8 V) supplied to a logic circuit portion configured with a SiFET. Some control signals input to the CPU core and some control signals input to the cache are input to the level shifters. The CPU core outputs a signal (SLEEPING) showing whether the CPU core is in a resting state or not. The signal (SLEEPING) is input to the PMU. A clock signal (Clock) input from the outside is input to the clock control circuit and the PMU. A clock signal (Gated clock) output from the clock control circuit is input to the CPU core, the cache, and the bus interface. The isolator is provided between the internal bus interface an external output (External). The isolator outputs a predetermined value as the external output during power gating, for example in order to prevent the external output from being an undefined value.

Figure 26:
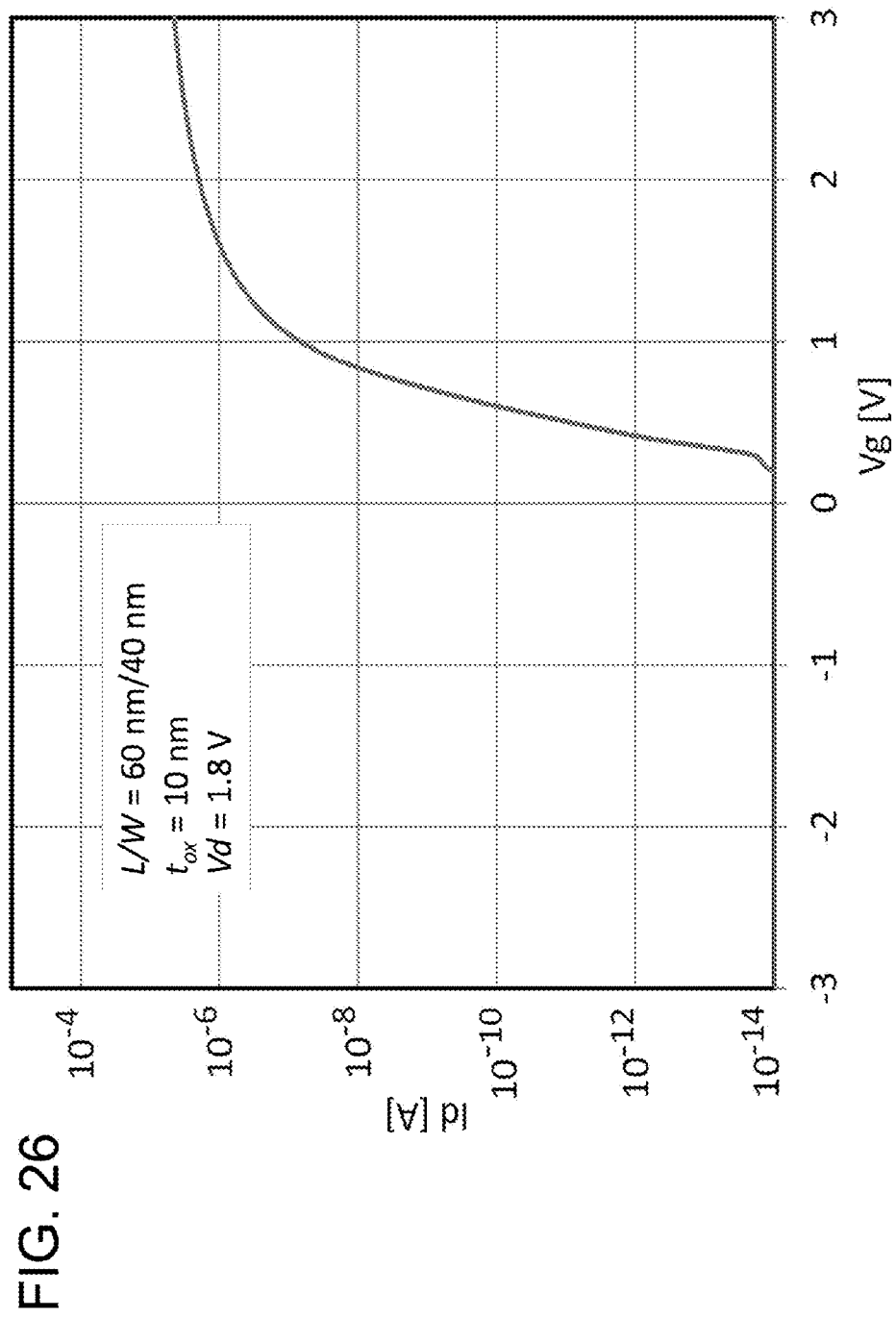
FIG. 26 shows the measurement results of drain current Id with respect to gate voltage Vg of a transistor.

FIG. 26 shows the measurement results of drain current Id with respect to a gate voltage Vg of the OSFET. The OSFET used for the measurement is a top-gate transistor in which a gate electrode, a source electrode, and a drain electrode are positioned over a CAAC-OS film with a gate insulating film positioned between the electrodes and the CAAC-OS film. The channel length L is 60 nm, the channel width W is 40 nm, and the gate insulating film has a thickness of 10 nm. In the measurement, voltage Vd between the source and the drain was set to 1.8 V. As shown in FIG. 26, the OSFET has excellent characteristics as a switch, and the off-state current is lower than or equal to the measurement limit.

Figure 27:
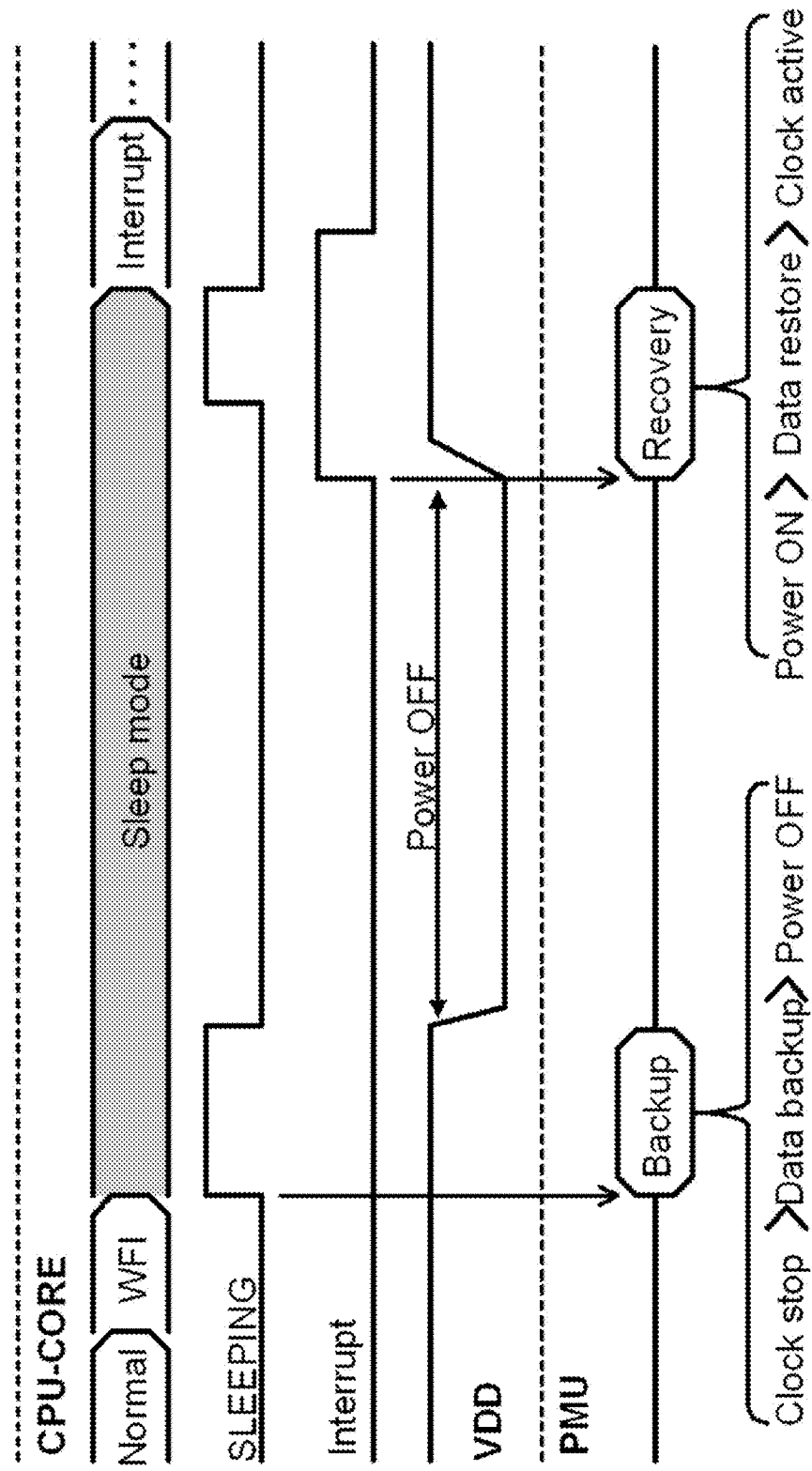
FIG. 27 schematically shows operation flow of a fabricated chip during power gating.

FIG. 27 schematically shows the operation procedure of the chip shown in FIG. 25 during power gating. The PMU is started up in accordance with the signal SLEEPING from the CPU core. The PMU sends a signal for instructing data backup to a memory cell included in the OSFF or the cache. Alternatively, in accordance with an interrupt signal (Interrupt) sent from the outside of the chip, the PMU sends a signal for instructing data recovery to the memory cell included in the OSFF or the cache.

Figure 28:
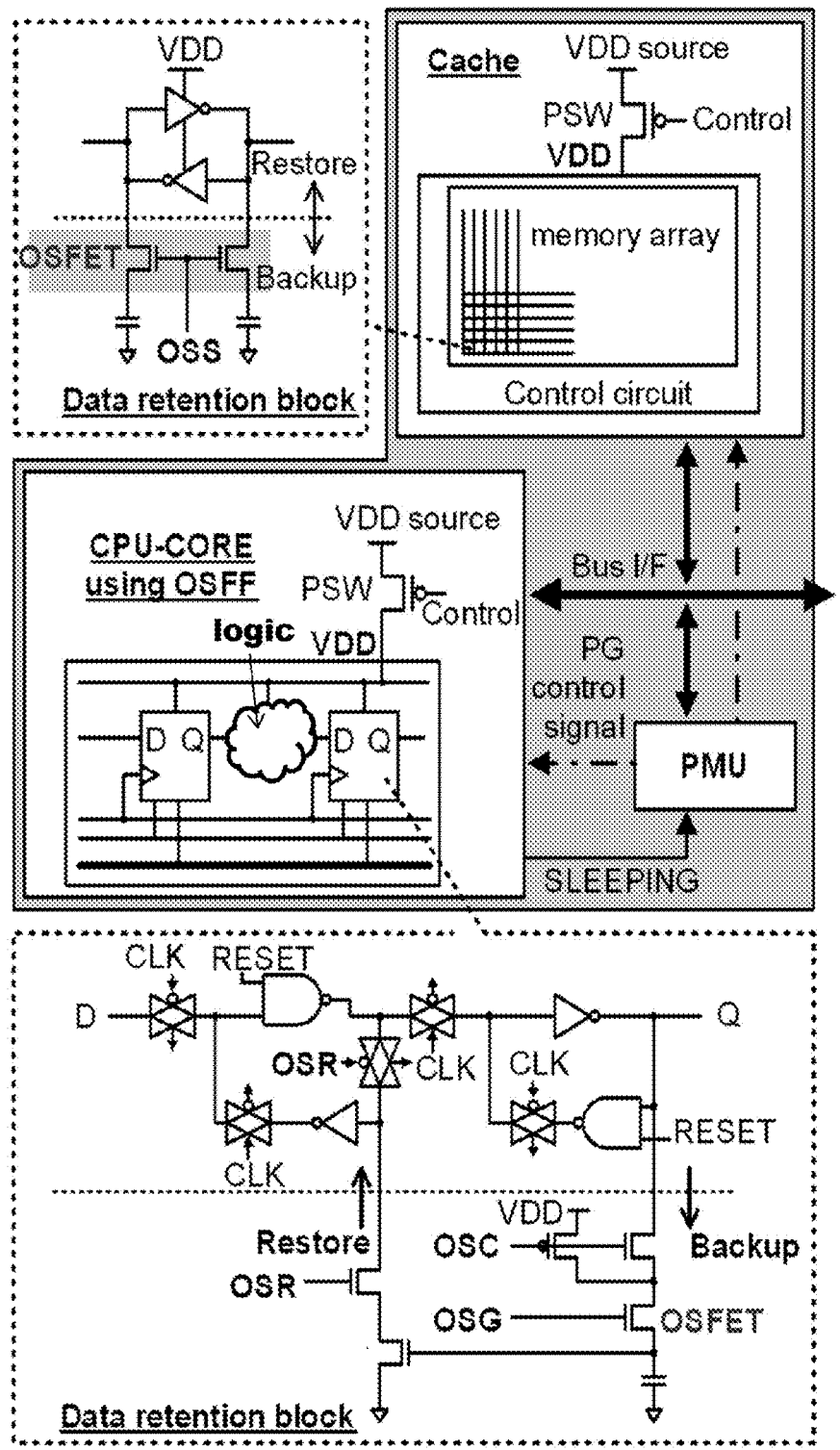
FIG. 28 shows a block diagram of a fabricated chip and circuit diagrams of data retention circuits provided in memory cells in an OSFF and a cache.

Next, FIG. 28 shows a block diagram of the fabricated chip and a circuit diagram of a data retention circuit (Date retention block) included in each of the memory cells in the OSFF and the cache. In the fabricated chip, the channel length of the OSFET is 60 nm, and the channel length of the Si FET is 180 nm.

The data retention circuit is mounted on each bit of the memory cells in the OSFF and the cache, and retains data written in a capacitor using the OSFET. The switching of the data retention circuit and the power switch (PSW) is controlled by the PMU. A potential supplied to the gate of the OSFET to turn the OSFET on is a potential that is level-shifted by the threshold voltage of the OSFET.

Figure 29:
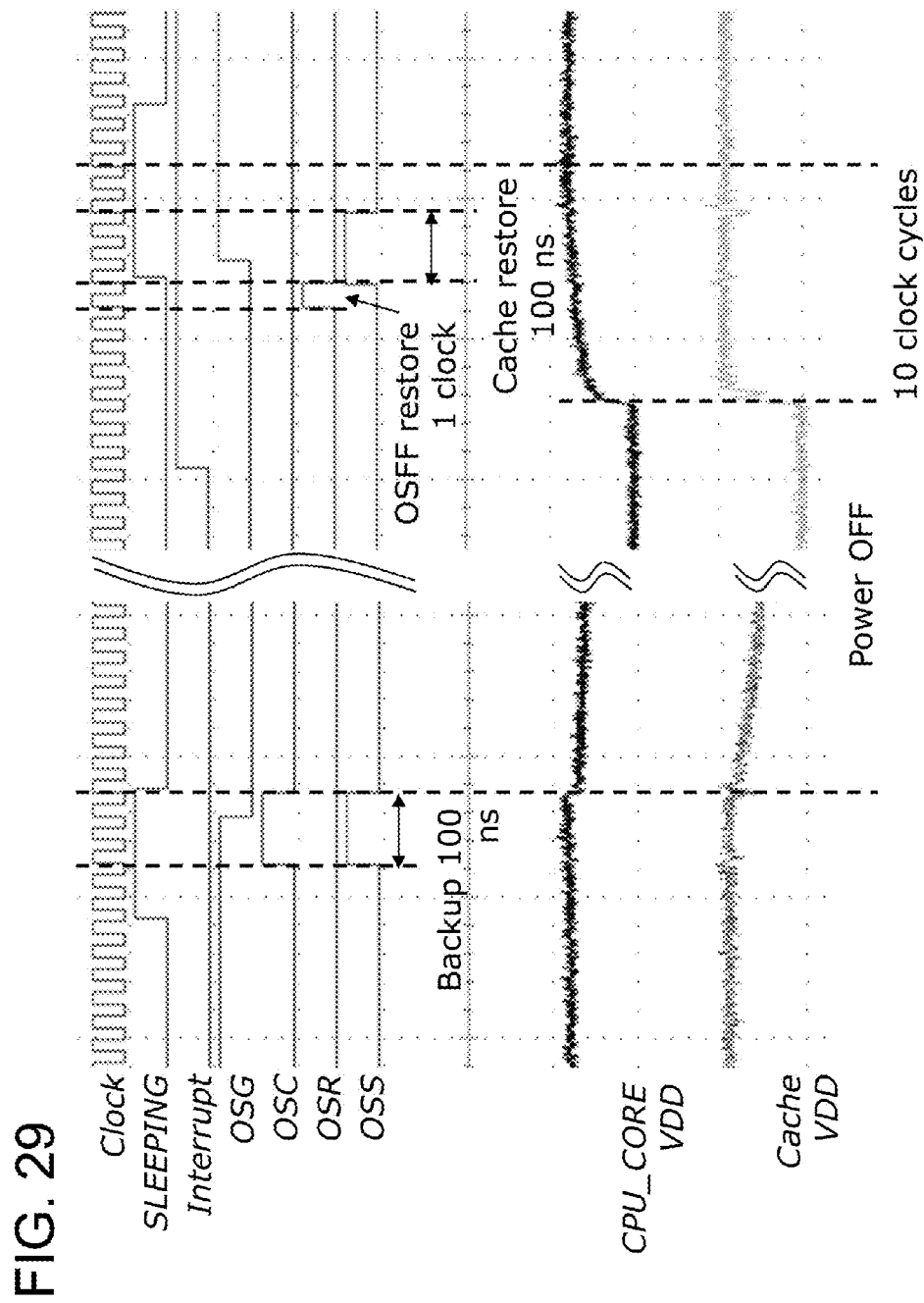
FIG. 29 shows waveforms of each potential in a fabricated chip.

FIG. 29 shows waveforms of potentials of the fabricated chip in an operation at 30 MHz including power gating. To perform data backup and be in a state right before power supply was stopped, in both the cache and the CPU core, time (100 ns) for turning on the OSFET and writing data was required. Furthermore, as illustrated in FIG. 29, at the time of recovery from the state in which power supply was stopped, time for stabilizing the power supply voltage and data recovery time (33 ns, which corresponds to 1 clock when frequency is 30 MHz) were required in the CPU core, and time (100 ns) for turning on the OSFET and recovering data, and time for stabilizing the power supply voltage were required in the cache. Thus, recovery from the state in which power supply was stopped was able to be performed in 10 cycles of the clock signal (Clock).

In the case where data in the cache is backed up to another nonvolatile memory, for example, the number of cycles of the clock signal corresponding to the number of words in the data to be backed up are needed. Thus, it can be said that power gating can be performed in an extremely short time in the fabricated chip as compared to the case where data is backed up to another nonvolatile memory.

Figure 30:
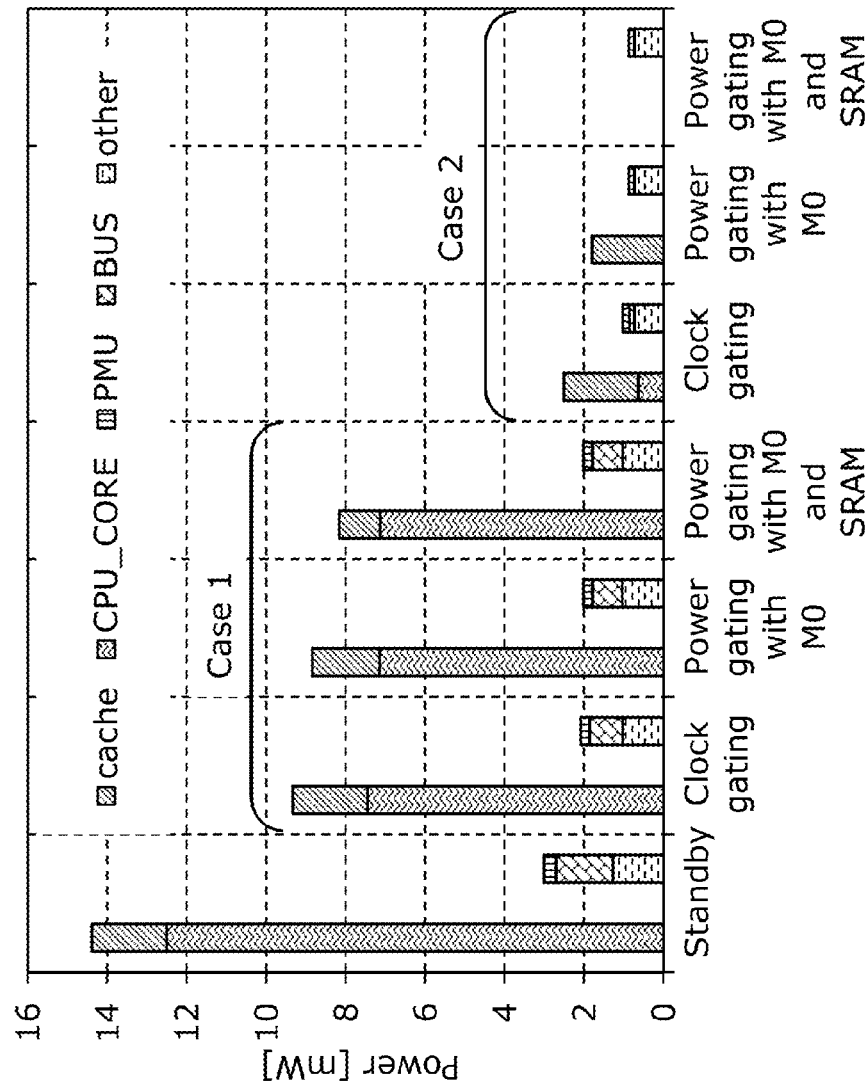
FIG. 30 shows the measurement results of power needed for a fabricated chip.

FIG. 30 shows the measurement results of the power needed for the fabricated chip. The vertical axis indicates the power consumption (mW). The horizontal axis indicates the operation modes of the chip. Specifically, the operation modes are as follows: an operation mode (Standby) in which the chip is in a standby state without clock gating or power gating; an operation mode (Clock gating) in which clock gating is performed; an operation mode (Power gating with M0) in which power gating is performed in the CPU core; and an operation mode (Power gating with M0 and SRAM) in which power gating is performed in the CPU core and the cache. The current values in the respective operation modes were measured. Note that for the operation mode (Clock gating) in which clock gating is performed, the operation mode (Power gating with M0) in which power gating is performed in the CPU core, and the operation mode (Power gating with M0 and SRAM) in which power gating is performed in the CPU core and the cache, the power consumption in the following two cases was measured: Case 1 where a 100-ms operating state (Active) and a 100-ms resting state (Sleep) are alternated and Case 2 where a 100-ms operating state (Active) and a 60-ms resting state (Sleep) are alternated.

As seen from FIG. 30, in Case 2 whose conditions presuppose the use as a sensor, in the operation mode (Power gating with M0 and SRAM) in which power gating is performed in the CPU core and the cache, leakage current flowing through a power supply line can be reduced by more than or equal to 99% as compared to the operation mode (Clock gating) in which clock gating is performed. This shows that power gating in the cache and the CPU core contributes greatly to a reduction in power consumption. It was observed that data was able to be retained in the fabricated chip for longer than or equal to 24 hours in a period during which the power supply voltage was not supplied, and this retention time suggests that the off-state current of the OSFET was lower than that of the SiFET by 7 or more orders of magnitude. Thus, the OSFET is suitable for a data retention circuit.

Figure 32:
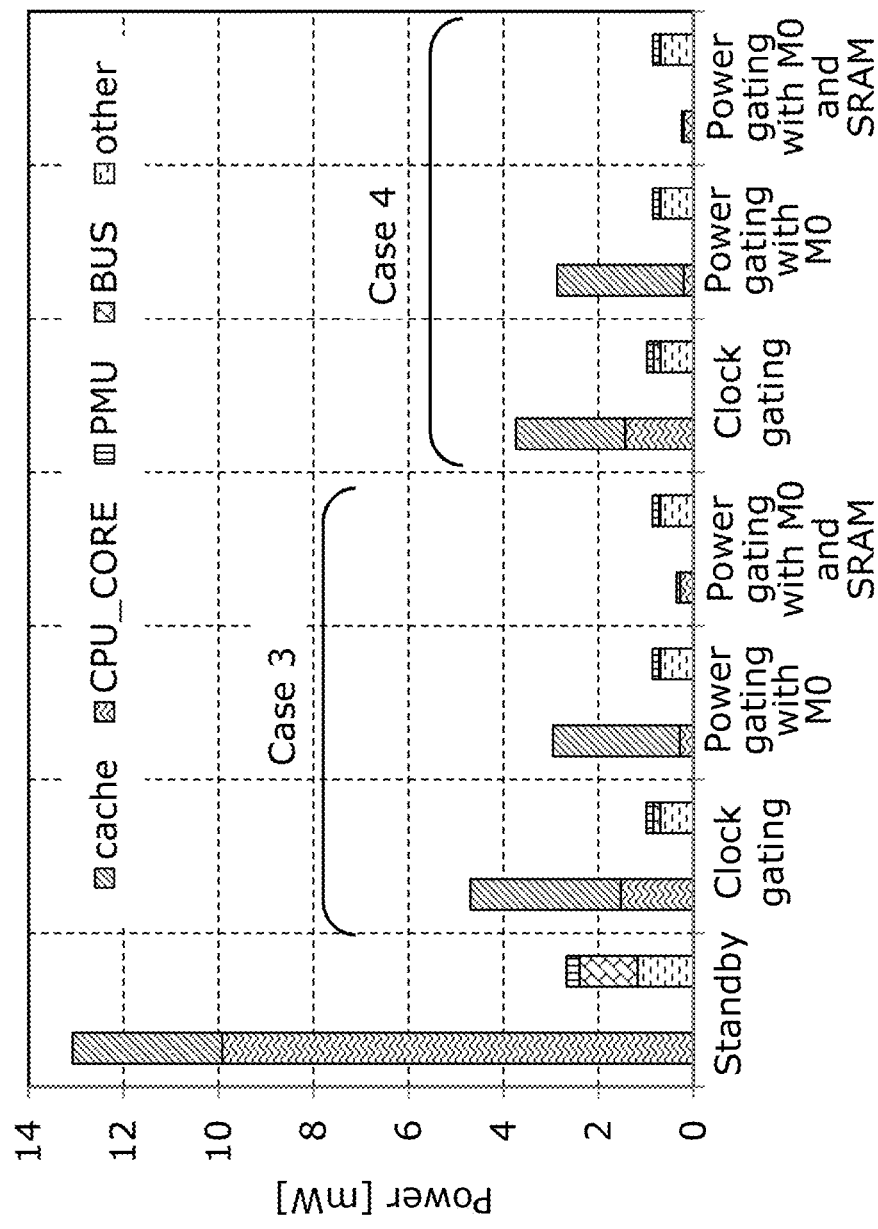
FIG. 32 shows the measurement results of power needed for a fabricated chip.

FIG. 32 shows the measurement results of power needed for the fabricated chip under the conditions different from the above-described conditions. The vertical axis indicates the power consumption (mW). The horizontal axis indicates the operation modes of the chip. For the operation modes of the chip in the horizontal axis, the description of FIG. 30 can be referred to. For the operation mode (Clock gating) in which clock gating is performed, the operation mode (Power gating with M0) in which power gating is performed in the CPU core, and the operation mode (Power gating with M0 and SRAM) in which power gating is performed in the CPU core and the cache, the power consumption was measured using two cases. One is a case (Case 3) where a 20-ms operating state per second is repeated (20 ms activity rate in 1 sec duty cycle). The other is a case (Case 4) where a 50-ms operating state per three seconds is repeated (50 ms activity rate in 3 sec duty cycle). The measurement conditions of Case 3 and Case 4 presuppose the use as a sensor that accesses data more frequently than that in Case 2.

As shown in FIG. 32, in Case 3 and Case 4, in the operation mode (Power gating with M0 and SRAM) in which power gating is performed in the CPU core and the cache, leakage current flowing through a power supply line can be reduced by more than or equal to 90% as compared to the operation mode (Clock gating) in which clock gating is performed. This shows that power gating in the cache and the CPU core contributes greatly to a reduction in power consumption also in the case where the chip becomes in a resting state once a few seconds.

Figure 33:
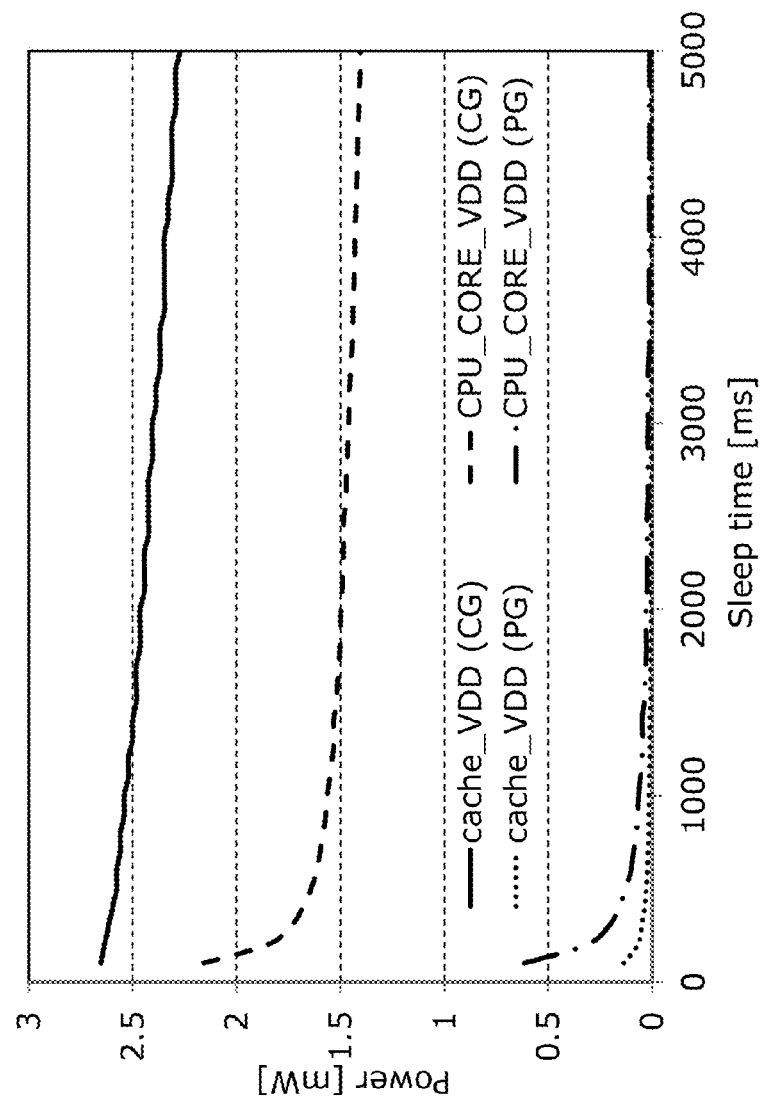
FIG. 33 shows the measurement results of power needed for a fabricated chip.

FIG. 33 shows the measurement results of power needed for the fabricated chip under the conditions different from those shown in FIG. 30 and FIG. 32. The power consumption in the case where an operating state and a resting state were repeated was measured. Specifically, the power consumption of the operation method in which clock gating is performed in the resting state and the power consumption of the operation method in which power gating is performed in the resting state were measured. The vertical axis indicates the power consumption (mW). The horizontal axis indicates the resting time (Sleep time). The operating time was fixed to 4 ms, whereas the resting time (Sleep time) varied. The solid line indicates the power (cache_VDD (CG)) consumed in the cache in the operation method in which clock gating is performed. The chain line indicates the power (CPU_CORE_VDD (CG)) consumed in the CPU core in the operation method in which clock gating is performed. The dotted line indicates the power (cache_VDD (PG)) consumed in the cache in the operation method in which power gating is performed. The dashed-dotted line indicates the power (CPU_CORE_VDD (PG)) consumed in the CPU core in the operation method in which power gating is performed.

As shown in FIG. 33, in the case where the resting time (Sleep time) is longer than or equal to 100 ms, in the operation method in which power gating is performed in the CPU core and the cache, leakage current flowing through a power supply line can be reduced by more than or equal to 70% as compared to the operation method in which clock gating is performed. Moreover, in the case where the sleep time is longer than or equal to 400 ms, the leakage current can be reduced by more than or equal to 90%. Thus, it is found that power gating in the cache and the CPU core contributes greatly to a reduction in power consumption also in the case of a frequent resting state.

Table 7 shows the evaluation results of the fabricated chip. The fabrication technology (Fabrication technology) is a combination of the OSFET with a channel length of 60 nm and the SiFET with a channel length of 180 nm. The clock frequency was 30 MHz. The area overhead of an SRAM cell (Area overhead of SRAM cell) used for the cache was 0%. The backup time (Backup time) was 100 ns. The recovery time (Recovery time) was 10 clock cycles, which includes the data restoration time (100 ns). The data retention time (Data retention) was longer than or equal to 24 hours. The leakage current reduction (Leakage current reduction) was larger than or equal to 99%.

TABLE 7

Evaluation of power gating in chip

| | |
|---|---|
| Fabrication technology | 180 nm Si and 60 nm CAAC-OS |
| Clock Frequency | 30 MHz |
| Area overhead of SRAM cell | ±0% |
| Backup time | 100 ns |
| Recovery time | 10 clock cycles (including data restoration time (100 ns)) |
| Data retention | more than 24 h |
| Leakage current reduction | more than 99% |

Figure 31:
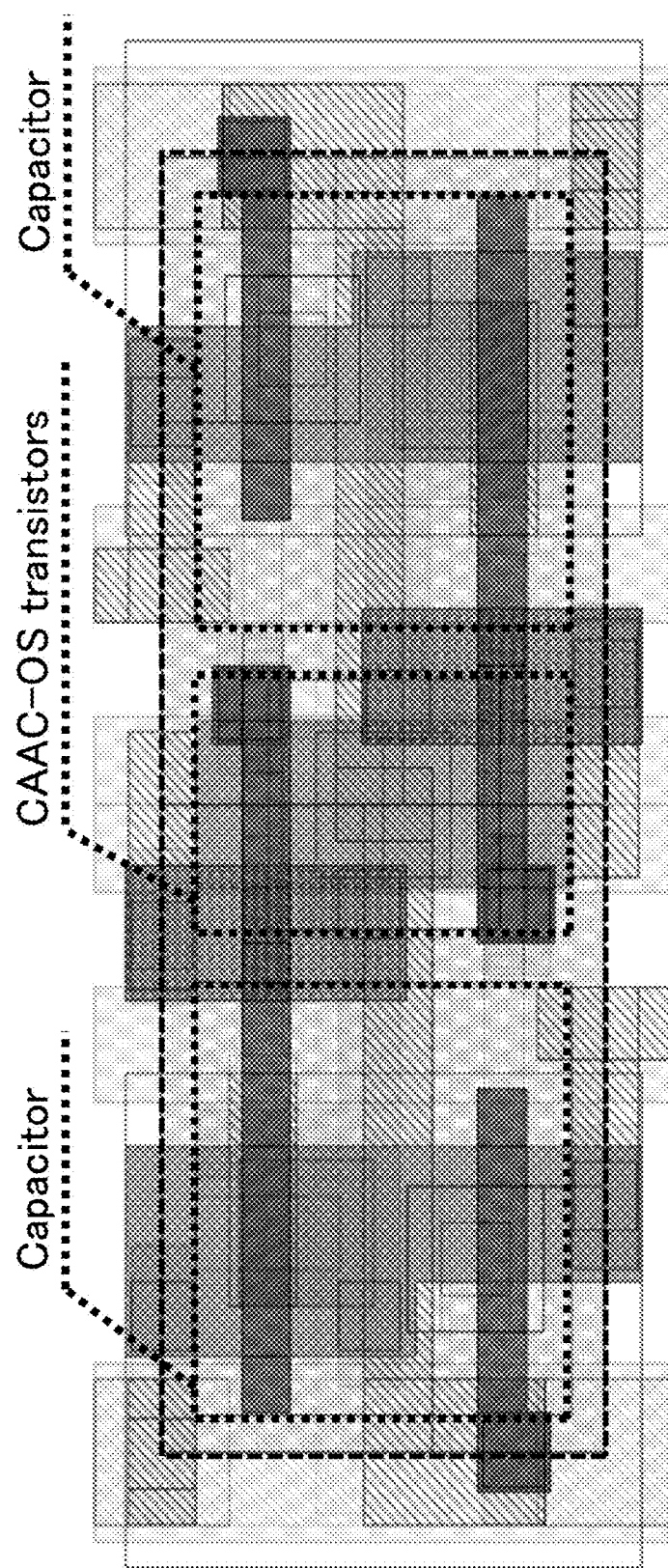
FIG. 31 shows a layout of a memory cell in a cache.

Although the combination of the OSFET with a channel length of 60 nm and the SiFET with a channel length of 180 nm was used in the fabricated chip, a combination of the OSFET with a channel length of 60 nm and a further miniaturized SiFET can further suppress an increase in area. To prove this, a layout of the memory cell which is in the cache and in which the OSFET with a channel length of 60 nm and a SiFET with a channel length of 45 nm were combined was made. FIG. 31 shows the layout of the memory cell in the cache. Two OSFETs and a capacitor that are included in the data retention circuit can be stacked over the SiFET; thus, the area was not increased even when the data retention circuit was stacked over an SRAM including the SiFET that was laid out in a 45-nm process rule.

Table 8 shows the simulated operational performance of the memory cell in the cache. In the simulation, a low-power 45-nm SiFET was used as a model and the power supply voltage was set to 1.1 V. The simulation results show that an increase in time for reading data (Read time) and an increase in time for writing data (Write time) were each approximately a few pico seconds (ps). Thus, it can be said that the operation frequency is hardly influenced even in the case of use at several hundreds megahertz or more. Therefore, it is found that the area and the performance of the memory cell in the cache are hardly influenced even when the data retention circuit including the OSFET with a channel length of 60 nm and the SRAM including the SiFET with a channel length of 45 nm are combined.

Specifically, when the data retention circuit including the OSFET with a channel length of 60 nm was provided over the SRAM including the SiFET that was laid out in a 45-nm process rule, the read time of the memory cell in the cache was 265 ps. When the data retention circuit was not provided, the read time of the memory cell in the cache was 263 ps. An increase in the read time caused by the existence of the data retention circuit was 2 ps, that is, the increase rate was 0.8%. When the data retention circuit was provided, the write time of the memory cell in the cache was 73 ps. When the data retention circuit was not provided, the write time of the memory cell in the cache was 64 ps. An increase in the write time caused by the existence of the data retention circuit was 9 ps, and the increase rate was 14%.

Figure 34A:
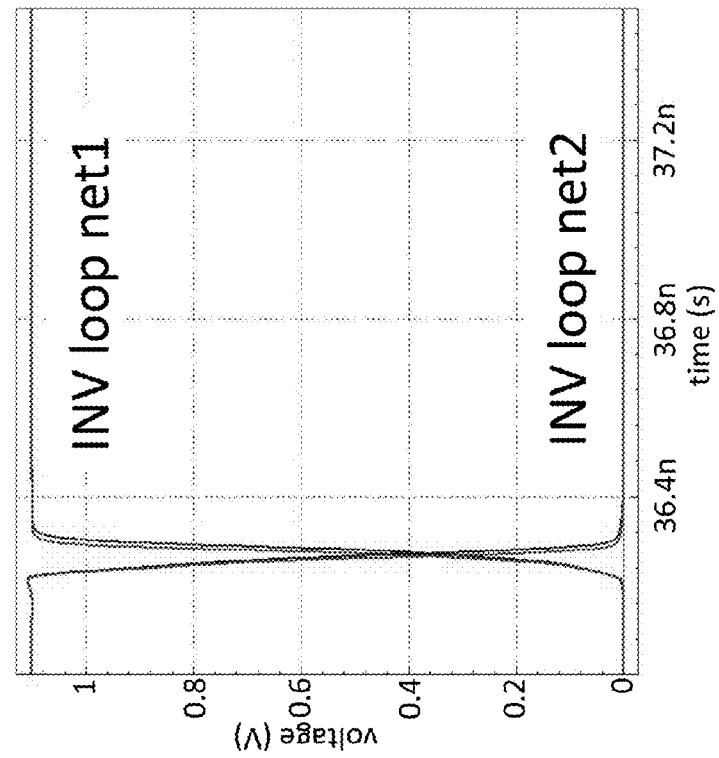
FIGS. 34A and 34B show simulated operation waveforms of a memory cell in a cache.
Figure 34B:
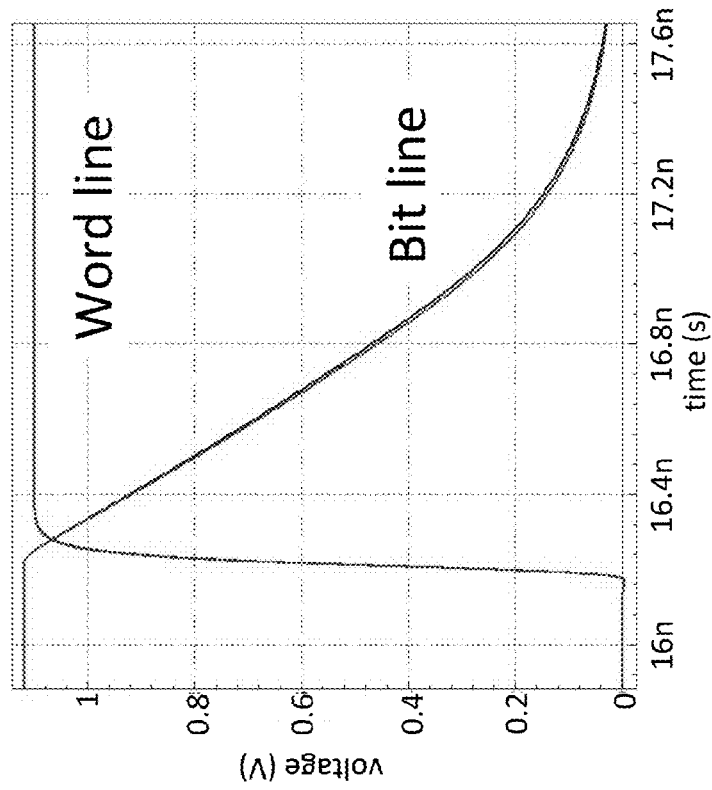

FIGS. 34A and 34B show the simulated operation waveforms of the memory cell in the cache. FIG. 34A is a waveform in reading. FIG. 34A shows the potentials of bit lines (the potentials in both of the following cases are denoted by Bit line) and the potentials of word lines (Word line) connected to the memory cells in the cache in the case with the data retention circuit and in the case without the data retention circuit. The potentials of the bit lines almost overlap with each other. FIG. 34B shows a waveform of writing. FIG. 34B shows the potentials of two nodes in inverter loops included in the SRAM in the case with the data retention circuit and in the case without the data retention circuit (the potentials in both cases are denoted by NV loop net1 and NV loop net2). The potentials of the nodes almost overlap with each other. Therefore, it is found that the cache performance is hardly influenced even when the data retention circuit including the OSFET with a channel length of 60 nm and the SRAM including the SiFET with a channel length of 45 nm are combined.

TABLE 8

60 nm OSFET, 45 nm SiFET

| | |
|---|---|
| Area | 0.46 mm × 1.24 mm (+0%) |
| Read time | 265 ps (+0.8%) |
| Write time | 73 ps (+14%) |

This application is based on Japanese Patent Application serial No. 2013-187831 filed with Japan Patent Office on Sep. 11, 2013, Japanese Patent Application serial No. 2014-018579 filed with Japan Patent Office on Feb. 3, 2014, and Japanese Patent Application serial No. 2014-070121 filed with Japan Patent Office on Mar. 28, 2014, the entire contents of which are hereby incorporated by reference.

What is claimed is:
1. A memory device comprising:
a memory circuit;
a selection circuit electrically connected to the memory circuit, the selection circuit comprising a fourth transistor;
a first transistor, a channel formation region of the first transistor comprising oxide semiconductor;

a capacitor;
a second transistor; and
a node electrically connected to one of a source and a drain of the first transistor, one terminal of the capacitor, and a gate of the second transistor,
wherein the other of the source and the drain of the first transistor is electrically connected to the selection circuit,
wherein one of a source and a drain of the second transistor is electrically connected to the memory circuit,
wherein the first transistor and the fourth transistor are electrically connected in series,
wherein the selection circuit is configured to select one of a first potential corresponding to a data and a second potential supplied by a first wiring,
wherein the capacitor is configured to retain the one of the first potential and the second potential that is selected by the selection circuit, and
wherein a potential of the node is configured to be initialized by supplying the second potential from the first wiring to the capacitor through the first transistor and the fourth transistor.

2. The memory device according to claim 1, wherein the memory circuit is configured to retain the data by supply of power supply voltage.

3. The memory device according to claim 1,
wherein the selection circuit further comprises a fifth transistor,
wherein one of a source and a drain of the fourth transistor is electrically connected to the first wiring,
wherein one of a source and a drain of the fifth transistor is electrically connected to the memory circuit, and
wherein the other of the source and the drain of the fourth transistor and the other of the source and the drain of the fifth transistor are electrically connected to the other of the source and the drain of the first transistor.

4. The memory device according to claim 1,
wherein the selection circuit further comprises a fifth transistor,
wherein one of a source and a drain of the fourth transistor is electrically connected to the first wiring,
wherein one of a source and a drain of the fifth transistor is electrically connected to the memory circuit,
wherein the other of the source and the drain of the fourth transistor and the other of the source and the drain of the fifth transistor are electrically connected to the other of the source and the drain of the first transistor, and
wherein a gate of the fourth transistor is electrically connected to a gate of the fifth transistor.

5. The memory device according to claim 1, wherein a channel formation region of the second transistor comprises crystalline silicon.

6. A memory device comprising:
a memory circuit;
a selection circuit electrically connected to the memory circuit, the selection circuit comprising a fourth transistor;
a first transistor, a channel formation region of the first transistor comprising oxide semiconductor;
a capacitor;
a second transistor; and
a node electrically connected to one of a source and a drain of the first transistor, one terminal of the capacitor, and a gate of the second transistor,
wherein the other of the source and the drain of the first transistor is electrically connected to the selection circuit,
wherein one of a source and a drain of the second transistor is electrically connected to the memory circuit,
wherein the first transistor and the fourth transistor are electrically connected in series,
wherein the selection circuit is configured to select one of a first potential corresponding to a data and a second potential supplied by a first wiring,
wherein the capacitor is configured to retain the one of the first potential and the second potential that is selected by the selection circuit,
wherein a potential of the node is configured to be initialized by supplying the second potential from the first wiring to the capacitor through the first transistor and the fourth transistor, and
wherein the second transistor is configured to control a conduction state between the memory circuit and a second wiring, in accordance with a potential retained in the capacitor.

7. The memory device according to claim 6, wherein the memory circuit is configured to retain the data by supply of power supply voltage.

8. The memory device according to claim 6,
wherein the selection circuit further comprises a fifth transistor,
wherein one of a source and a drain of the fourth transistor is electrically connected to the first wiring,
wherein one of a source and a drain of the fifth transistor is electrically connected to the memory circuit, and
wherein the other of the source and the drain of the fourth transistor and the other of the source and the drain of the fifth transistor are electrically connected to the other of the source and the drain of the first transistor.

9. The memory device according to claim 6,
wherein the selection circuit further comprises a fifth transistor,
wherein one of a source and a drain of the fourth transistor is electrically connected to the first wiring,
wherein one of a source and a drain of the fifth transistor is electrically connected to the memory circuit,
wherein the other of the source and the drain of the fourth transistor and the other of the source and the drain of the fifth transistor are electrically connected to the other of the source and the drain of the first transistor, and
wherein a gate of the fourth transistor is electrically connected to a gate of the fifth transistor.

10. The memory device according to claim 6, wherein a channel formation region of the second transistor comprises crystalline silicon.

11. The memory device according to claim 6, wherein the other terminal of the capacitor is electrically connected to the second wiring.

12. A memory device comprising:
a memory circuit;
a selection circuit electrically connected to the memory circuit, the selection circuit comprising a fourth transistor;
a first transistor, a channel formation region of the first transistor comprising oxide semiconductor;
a capacitor;
a second transistor;
a node electrically connected to one of a source and a drain of the first transistor, one terminal of the capacitor, and a gate of the second transistor; and a third transistor electrically connected to the second transistor in series, wherein the other of the source and the drain of the first transistor is electrically connected to the selection circuit, wherein one of a source and a drain of the second transistor is electrically connected to one of a source and a drain of the third transistor, wherein the other of the source and the drain of the third transistor is electrically connected to the memory circuit, wherein the first transistor and the fourth transistor are electrically connected in series, wherein the selection circuit is configured to select one of a first potential corresponding to a data and a second potential supplied by a first wiring, wherein the capacitor is configured to retain the one of the first potential and the second potential that is selected by the selection circuit, wherein a potential of the node is configured to be initialized by supplying the second potential from the first wiring to the capacitor through the first transistor and the fourth transistor, and wherein the second transistor and the third transistor are configured to control a conduction state between the memory circuit and a second wiring, in accordance with a potential retained in the capacitor and a signal supplied to a gate of the third transistor.

13. The memory device according to claim 12, wherein the memory circuit is configured to retain the data by supply of power supply voltage.

14. The memory device according to claim 12, wherein the selection circuit further comprises a fifth transistor, wherein one of a source and a drain of the fourth transistor is electrically connected to the first wiring, wherein one of a source and a drain of the fifth transistor is electrically connected to the memory circuit, and wherein the other of the source and the drain of the fourth transistor and the other of the source and the drain of the fifth transistor are electrically connected to the other of the source and the drain of the first transistor.

15. The memory device according to claim 12, wherein the selection circuit further comprises a fifth transistor, wherein one of a source and a drain of the fourth transistor is electrically connected to the first wiring, wherein one of a source and a drain of the fifth transistor is electrically connected to the memory circuit, wherein the other of the source and the drain of the fourth transistor and the other of the source and the drain of the fifth transistor are electrically connected to the other of the source and the drain of the first transistor, and wherein a gate of the fourth transistor is electrically connected to a gate of the fifth transistor.

16. The memory device according to claim 12, wherein a channel formation region of each of the second and the third transistors comprises crystalline silicon.

17. The memory device according to claim 12, wherein the other terminal of the capacitor is electrically connected to the second wiring.

18. A memory device comprising:
a memory circuit;
a selection circuit comprising a fourth transistor and a fifth transistor;
a first transistor, a channel formation region of the first transistor comprising oxide semiconductor;
a capacitor;
a second transistor; and
a node electrically connected to one of a source and a drain of the first transistor, one terminal of the capacitor, and a gate of the second transistor, wherein one of a source and a drain of the second transistor is electrically connected to the memory circuit, wherein one of a source and a drain of the fourth transistor is electrically connected to a first wiring, wherein one of a source and a drain of the fifth transistor is electrically connected to the memory circuit, wherein the other of the source and the drain of the fourth transistor and the other of the source and the drain of the fifth transistor are electrically connected to the other of the source and the drain of the first transistor, wherein the first transistor and the fourth transistor are electrically connected in series, wherein the first transistor and the fifth transistor are electrically connected in series, and wherein a potential of the node is configured to be initialized by supplying a potential from the first wiring to the capacitor through the first transistor and the fourth transistor.

19. The memory device according to claim 18, wherein the memory circuit is configured to retain data by supply of power supply voltage.

20. The memory device according to claim 18, wherein a gate of the fourth transistor is electrically connected to a gate of the fifth transistor.

21. The memory device according to claim 18, wherein a channel formation region of the second transistor comprises crystalline silicon.

22. A memory device comprising:
a memory circuit;
a selection circuit comprising a fourth transistor and a fifth transistor;
a first transistor, a channel formation region of the first transistor comprising oxide semiconductor;
a capacitor;
a second transistor;
a node electrically connected to one of a source and a drain of the first transistor, one terminal of the capacitor, and a gate of the second transistor; and
a third transistor electrically connected to the second transistor in series, wherein one of a source and a drain of the second transistor is electrically connected to one of a source and a drain of the third transistor, wherein the other of the source and the drain of the third transistor is electrically connected to the memory circuit, wherein one of a source and a drain of the fourth transistor is electrically connected to a first wiring, wherein one of a source and a drain of the fifth transistor is electrically connected to the memory circuit, wherein the other of the source and the drain of the fourth transistor and the other of the source and the drain of the fifth transistor are electrically connected to the other of the source and the drain of the first transistor, wherein the first transistor and the fourth transistor are electrically connected in series, wherein the first transistor and the fifth transistor are electrically connected in series, and wherein a potential of the node is configured to be initialized by supplying a potential from the first wiring to the capacitor through the first transistor and the fourth transistor.

23. The memory device according to claim 22, wherein the memory circuit is configured to retain data by supply of power supply voltage.

24. The memory device according to claim 22, wherein a gate of the fourth transistor is electrically connected to a gate of the fifth transistor.

25. The memory device according to claim 22, wherein a channel formation region of the second transistor comprises crystalline silicon.

* * * * *